(12) United States Patent
Colgan et al.

(10) Patent No.: US 7,808,781 B2
(45) Date of Patent: Oct. 5, 2010

(54) APPARATUS AND METHODS FOR HIGH-PERFORMANCE LIQUID COOLING OF MULTIPLE CHIPS WITH DISPARATE COOLING REQUIREMENTS

(75) Inventors: Evan George Colgan, Chestnut Ridge, NY (US); Michael Anthony Gaynes, Vestal, NY (US); John Harold Magerlein, Yorktown Heights, NY (US); Kenneth Charles Marston, Poughquag, NY (US); Roger Ray Schmidt, Poughkeepsie, NY (US); Hilton T. Toy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 12/120,094

(22) Filed: May 13, 2008

(65) Prior Publication Data
US 2009/0284921 A1    Nov. 19, 2009

(51) Int. Cl.
*H05K 7/20* (2006.01)
*G06F 1/20* (2006.01)

(52) U.S. Cl. ............. 361/699; 361/679.53; 361/679.54; 361/702; 361/704; 361/719; 165/104.33; 257/714

(58) Field of Classification Search ............ 361/679.53, 361/699–700, 702, 704, 715, 719; 165/80.4, 165/104.33, 185, 908; 257/714, E23.098; 438/122
See application file for complete search history.

(56) References Cited

U.S. PATENT DOCUMENTS

| 6,351,384 | B1 * | 2/2002 | Daikoku et al. ............. 361/704 |
| 6,992,382 | B2 * | 1/2006 | Chrysler et al. ............. 257/717 |
| 7,139,172 | B2 * | 11/2006 | Bezama et al. ............. 361/699 |
| 7,190,580 | B2 * | 3/2007 | Bezama et al. ............. 361/699 |
| 7,230,334 | B2 * | 6/2007 | Andry et al. ................. 257/713 |
| 7,435,623 | B2 * | 10/2008 | Chrysler et al. ............. 438/122 |
| 2005/0128705 | A1 * | 6/2005 | Chu et al. .................... 361/699 |
| 2009/0218078 | A1 * | 9/2009 | Brunschwiler et al. . 165/104.33 |
| 2009/0234705 | A1 * | 9/2009 | Brunschwiler et al. ........ 705/10 |
| 2009/0283244 | A1 * | 11/2009 | Bezama et al. ............. 165/80.4 |

* cited by examiner

*Primary Examiner*—Jayprakash N Gandhi
*Assistant Examiner*—Robert J Hoffberg

(57) ABSTRACT

Apparatus and methods are provided for packaging multi-chip modules with liquid cooling modules designed to provide different thermal resistances for effectively conducting heat from various chips with disparate cooling requirements while minimizing mechanical stresses in thermal bonds due to thermal excursions.

14 Claims, 12 Drawing Sheets

APPARATUS AND METHODS FOR HIGH-PERFORMANCE LIQUID COOLING OF MULTIPLE CHIPS WITH DISPARATE COOLING REQUIREMENTS

BACKGROUND

1. Technical Field

The present invention relates generally to apparatus and methods for high-performance cooling of multi-chip package structures having multiple chips with disparate cooling requirements mounted on a common substrate. More specifically, the present invention relates to apparatus and methods for packaging multi-chip modules with liquid cooling modules designed to provide different thermal resistances needed for effectively conducting heat from various chips with disparate cooling requirements while minimizing mechanical stresses in thermal bonds due to thermal excursions.

2. Discussion of Related Art

In the design and manufacture of semiconductor IC (integrated circuit) chip packages and modules (e.g., SCM (single chip modules) or MCMs (multi-chip modules)), it is imperative to implement mechanisms that can effectively remove heat generated by IC chip devices (such as microprocessors) to ensure continued reliable operation of the devices. Effective heat removal becomes increasingly problematic as chip geometries are scaled down and operating speeds are increased, which results in increased power density. Although improved IC chip module designs are being developed to operate at higher clock frequencies, increased system performance is increasingly being limited by the ability to implement effective heat removal mechanisms to cool the IC chip modules.

Cooling techniques are especially problematic for a multi-chip module or other multi-chip package structures where an array of chips is mounted on a common substrate. One conventional cooling solution for multiple chips on a common carrier is to thermally couple a thermal hat or package cap/lid/cover to the backside (inactive surface) of the semiconductor IC chips using a mechanically compliant, thermally conductive material (e.g., thermally conductive paste) as a thermal interface. Compliant thermally conductive materials include, for example, thermal pastes, thermal greases, or thermally conductive fluids such as oils, and are frequently referred to as thermal interface materials, or thermal interface materials (TIMs). The package lid or thermal hat, which can be formed of a high thermal conductivity material, such as copper or aluminum, will conduct heat away from the IC chip(s) and the heat is removed from the cooling plate or heat sink by methods such as forced air cooling or circulating liquid coolants.

In general, compliant thermally conductive materials are typically used (as opposed to a rigid or semi-rigid bond) to thermally couple an IC chip to a thermal hat when, for example, the difference in thermal expansion between the material of the IC chip (typically, silicon, Si), the package substrate, which may be a ceramic or polymer, and the material of the thermal hat is relatively large. For large, high performance MCMs, a preferred substrate material is a glass-ceramic, which has a CTE matched to that of silicon. For example, silicon has a linear coefficient of thermal expansion (CTE) of about 2.5 ppm/° C., copper has a CTE of about 16.5 ppm/° C. and aluminum has a CTE of about 23 ppm/° C. Given the significant difference between the thermal expansion between an Si chip, a glass-ceramic substrate, and of a thermal hat made of Cu or Al, and given the large contact area between the thermal hat and the multiple Si chips mounted on a common substrate, there is a relatively long distance for any difference in thermal expansion to act over. In this regard, the use of a compliant thermally conductive material layer as a thermal interface between the chip and thermal hat reduces stress at the thermal interface due to differences in thermal expansion of the IC chip, substrate, and the thermal hat.

Although a rigid bond typically has a lower thermal resistance than a layer of compliant thermally conductive material, the ability to effectively use a rigid bond is limited not only by the difference in the CTEs of the materials that form the thermal hat and the IC chips and substrate, but also on the temperature range (cycle) in which the semiconductor package will operate or be exposed to, as well as size of the area over which the rigid bond will be formed. Indeed, when the thermal expansion of the materials that form the heat spreader, the substrate, and IC chip are closely matched, a rigid bond may be used to thermally couple the heat spreader to the IC chip.

Other techniques include the use of flexible filled polymer adhesive materials to form a "semi-rigid" bond. Such materials can accommodate a limited amount of thermal expansion mismatch between a silicon chip and a copper lid, for example, as long as the area is not too large and the temperature range is not too great. These types of thermal bonds differ from a compliant thermally conductive material layer in that they are not liquid and can tear or delaminate if too great a shear stress is applied. Depending on the polymer used, a filled polymer material can also be a rigid thermal adhesive, such as a silver filled epoxy.

There are various challenges and disadvantages associated with cooling solutions for MCMs using a common thermal hat with a compliant TIM. Differences in thermal expansion between the materials that form the package substrate, the chips, and the thermal hat, for example, can result in both vertical and horizontal deflections during power or temperature cycling. These deflections can lead to the migration of the compliant thermally conductive material out of the gap between the IC chips and the thermal hat, resulting in voids that increase the thermal resistance between the IC chip and the thermal hat and causing local increases in the operating temperature of the IC chips.

Another disadvantage to conventional MCM cooling solutions using a common thermal hat is that the chips mounted to the common substrate may have widely disparate cooling requirements, requiring custom solutions. For example, a processor chip may have a higher power density ($W/cm^2$) than that of a memory chip mounted on the same substrate. When using compliant thermally conductive material as the thermal bond, it is generally desirable to form as thin a layer as possible so as to reduce the thermal resistance for heat conduction from the chips to the thermal hat. However, the chips can vary in thickness and tilt and the substrate may not be perfectly flat, so it is very difficult to establish a thin layer of compliant thermally conductive material between a common cooler and multiple chips.

By way of example, when the chips mounted on a common substrate vary in thickness, the thickness of the bond line will generally be determined by the back surface of the thickest chip. When attaching a thermal hat over multiple chips on a carrier, it is desirable to ensure that the high power chip have the thinnest bond layer of thermally conductive material. If the memory chips were thicker than the processor chip, the thickness of the bond line of the thermally conductive material used to attach the processor chip to the thermal hat would be greater than that of the TIM layer between the thermal hat and the memory chip.

Moreover, maximum allowed device junction temperature may be different for different chips mounted on a common substrate, requiring that the thicknesses of the thermal interface material between some chips and the thermal hat be less than a certain value. The power density of the chips and also the desired junction temperature or power distribution of power on the chip are factors that are considered when determining the thermal resistance required to adequately cool the chips.

Moreover, processor chips and other high-performance chips frequently have a "hot spot" which can have a heat flux ($W/cm^2$) significantly greater than the average heat flux resulting in temperatures 20° C. hotter than the average chip temperature. A thermal solution which may generally be adequate for the average chip power density of various chips mounted on an MCM substrate may not be adequate to allow reliable operation of the hot spot region of the chip.

BRIEF SUMMARY

Exemplary embodiments of the invention generally include apparatus and methods for high-performance cooling of multi-chip package structures having multiple chips with disparate cooling requirements mounted on a common substrate. More specifically, exemplary embodiments of the invention include apparatus and methods for packaging multi-chip modules with liquid cooling modules designed to provide different thermal resistances for effectively conducting heat from various chips with disparate cooling requirements while minimizing mechanical stresses in thermal bonds due to thermal excursions.

One exemplary embodiment of an electronic apparatus according to the invention includes a chip level package structure having a package substrate, first and second IC (integrated circuit) chips flip-chip mounted on a first surface of the package substrate, and an array of contacts formed on a second surface of the package substrate opposite the first surface, and a cooling module thermally coupled to the first and second IC chips. The cooling module includes a liquid coolant inlet port, a liquid coolant outlet port, and a coolant flow path extending within the cooling module from the inlet port to the outlet port. The first chip is thermally coupled to a first portion of the cooling module which is cooled by coolant flowing in the coolant flow path, and the second chip is thermally coupled to a second portion of the cooling module which is cooled by heated coolant fluid flowing in the coolant flow path. The coolant flow path may be structured such that a flow resistance of the coolant fluid flowing in the coolant flow path near the first portion of the cooling module is greater than a flow resistance of the heated coolant fluid flowing in the coolant flow path near the second portion of the cooling module. The first chip may be thermally coupled to the cooling module using a noncompliant thermally conductive bonding material such as a semi-rigid, flexible bond material or a rigid bonding material, and the second chip may be thermally coupled to the cooling module using a mechanically compliant thermally conductive material. The first chip may be a processor chip, and wherein the second chip may be a memory chip.

In another exemplary embodiment of the invention, the cooling module is a micro channel cooler having a first pattern of thermal micro fins that define micro channels having a first channel width and a second pattern of thermal micro fins that define micro channels having a second channel width that is greater than the first channel width. The first pattern of thermal micro fins define a portion of the cooling flow path that is proximately aligned to the first portion of the cooling module to which the first IC chip is thermally coupled; and the second pattern of thermal micro fins define a portion of the cooling flow path that is proximately aligned to the second portion of the cooling module to which the second IC chip is thermally coupled. The micro channel cooler may be formed of a metallic material, wherein the first IC chip is thermally bonded to the micro channel cooler using a semi-rigid, flexible bond material or an Indium solder layer, and wherein the second chip is thermally coupled to the micro channel cooler using a mechanically compliant thermally conductive material. In another exemplary embodiment of the invention, a base ring is bonded to the cooler module and package substrate to form a semi-hermetic enclosure around the first and second IC chips.

In another exemplary embodiment of the invention, the cooling module, which is thermally coupled to the first and second IC chips, may include a planar heat conducting device, a cooler assembly, and a fluid manifold. The planar heat conducting device has first and second opposing surfaces, and an aperture formed through the planar heat conducting device between the first and second opposing surfaces thereof wherein the cooler assembly is disposed in the aperture of the planar heat conducting device. The cooler assembly includes first and second opposing surfaces, an inlet port, and outlet port disposed on the first surface, and a coolant flow path extending through the cooler assembly from the inlet port to the outlet port. The fluid manifold includes an inlet plenum and an outlet plenum which define portions of the coolant flow path of the cooling module. The inlet and outlet plenums are configured such that fluid flow in the inlet and outlet plenums is in direct contact with the planar heat conducting device. The planar heat conducting device is stacked on the first level chip package structure where the backside of the first IC chip is thermally bonded to the second surface of the cooler assembly and where the second IC chip is thermally coupled to a region of the second surface of the planar heat conducting device. The cooling module may further include a first fluid connection between the input port of the cooler assembly and the inlet plenum of the fluid manifold, and a second fluid connection between the output port of the cooler assembly and the outlet plenum of the fluid manifold.

In one exemplary embodiment of the invention, the fluid manifold may be a planar device having first and second opposing surfaces, where the first and second plenums are formed in the second surface thereof and having inlet and outlet ports formed in the first surface thereof where the inlet port extends from the first surface to the inlet plenum and the outlet port extends from the first surface to the outlet plenum, and where the second surface of the fluid manifold is mechanically coupled to the first surface of the planar heat conducting device such that inlet plenum is aligned to the inlet port of the cooler assembly and the outlet plenum is aligned to the outlet port of the cooler assembly.

In another exemplary embodiment of the invention, the fluid manifold is integrally formed as part of the planar heat conducting device wherein the inlet and outlet plenums are formed in the first surface of the planar heat conducting device surrounding the aperture, and are covered by a manifold cover plate.

In one exemplary embodiment of the invention, the cooler assembly may include a micro channel cooler device formed of silicon rigidly bonded to the first IC chip and having micro flow channels defined by a pattern of silicon thermal fins, and a micro manifold device stacked on the micro channel cooler device to distribute coolant to and from the micro channel cooler. The micro manifold device may include a surface that defines the first surface of the cooler assembly having the inlet and outlet ports of the cooler assembly, and wherein the micro manifold device includes input and output manifolds that define part of the coolant flow path extending through the cooler assembly from the inlet port to the outlet port.

In another exemplary embodiment of the invention, the cooler assembly may include an integrated device formed of metal and rigidly bonded to the first IC chip, where the integrated device includes cooling layers, manifolds, and a surface that defines the first surface of the cooler assembly having the inlet and outlet ports of the cooler assembly. The integrated device may include input and output manifolds that define part of the coolant flow path extending through the cooler assembly from the inlet port to the outlet port. The integrated device may include stacked micro channels, mesh structures, or staggered stacked micro channels.

These and other exemplary embodiments, aspects, features, and advantages of the present invention will become apparent from the following detailed description of exemplary embodiments, which is to be read in connection with the accompanying drawings.

DETAILED DESCRIPTION

Figure 1:
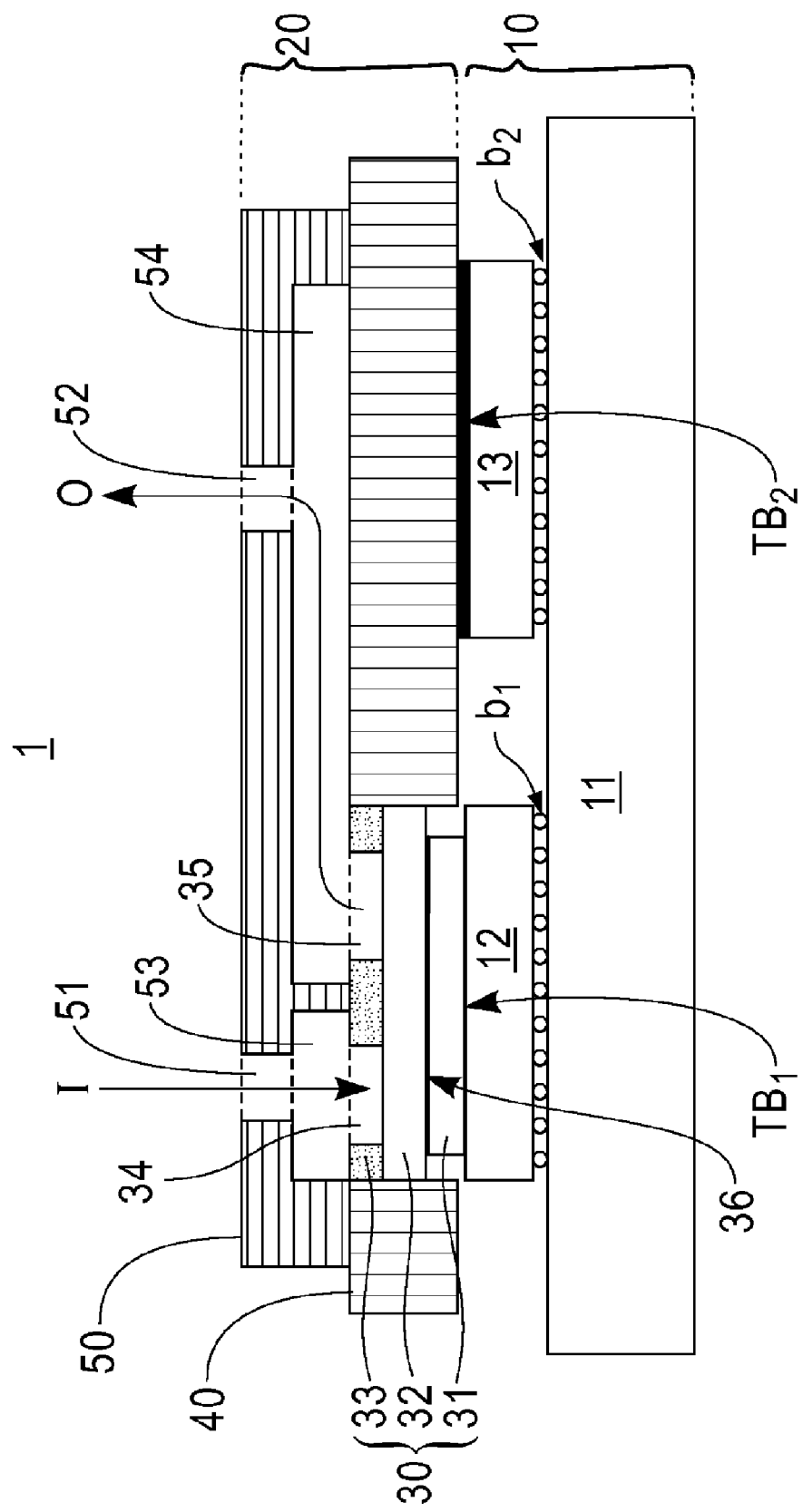
FIG. 1 is a schematic cross-sectional view of an electronic module according to an exemplary embodiment of the invention, which provides high-performance liquid cooling of a multi-chip module having multiple IC chips with disparate cooling requirements.

FIG. 1 is a schematic cross-sectional view of an electronic module according to an exemplary embodiment of the invention, which provides high-performance liquid cooling of a multi-chip module having multiple IC chips with disparate cooling requirements mounted face down on a common carrier. More specifically, FIG. 1 schematically illustrates an electronic module (1) comprising an IC chip module (10) with a plurality of IC chips (12) and (13) mounted face down on a multi-chip carrier (11), and a common liquid cooling module (20) (or cooling apparatus) that is thermally coupled to the non-active surfaces of the IC chips (12) and (13).

The chip module (10) may be a dual chip module (DCM) or multi-chip module (MCM), for example, where the IC chips (12) and (13) are mounted on the top surface of the chip carrier, which contains high density wiring, (11) arrays of fine pitch solder balls, such as C4s, (b1) and (b2) (~0.15 mm pitch). The chip carrier (11) may be a first level package carrier (e.g., ceramic substrate) with an array of large (~1 mm pitch) solder balls (e.g., BGA, ball grid array) for bonding the chip carrier (11) to a card or printed circuit board (not shown), or pads for use with a socket or land grid array connector to connect to said printed circuit board. The chip carrier (11) may be an intermediate carrier substrate (e.g., silicon substrate) which is bonded to a traditional first level package substrate via an array of fine pitch (~0.15 mm pitch) solder balls, such as C4s. The substrate (11) may be formed of a ceramic material or polymer material having a thermal coefficient of expansion close to that of silicon (Si) (or any other substrate material that forms the chips (12) and (13), such as GaAs, etc.). The substrate (11) comprises multiple layers of wiring which interconnect the chips (12) and (13) to each other and to contacts on the bottom surface of the substrate (11), which enable electrical connections to corresponding points on a printed circuit board (PCB) or another package level substrate.

In general, the cooling module (20) comprises a micro channel cooler assembly (30), a heat conducting plate (40) and a common coolant distribution manifold (50) (or "fluid manifold"). The micro channel cooler assembly (30) includes a micro channel cooler (31), a micro channel cooler manifold (32) and a positioning element (33) stacked on the back surface of the IC chip (12). The micro channel cooler assembly (30) comprises a fluid inlet (34) and fluid outlet (35). The micro channel cooler assembly (30) is disposed in an opening formed in the heat conducting plate (40), and is thermally coupled to the back surface of the IC chip (12) via a thermal bond ($TB_1$).

The heat conducting plate (40) is positioned over the chip module (10) so that the backside (inactive surface) of the IC chip (13) may be thermally coupled to a bottom surface of the heat conducting plate (40) via a thermal bond ($TB_2$). The fluid manifold (50) includes a fluid inlet port (51) and a fluid outlet port (52), an inlet plenum (53) and outlet plenum (54). The fluid inlet (34) of the micro channel cooler assembly (30) is aligned with the inlet plenum (53) of the fluid manifold (50) and the fluid outlet (35) of the micro channel cooler assembly (30) is aligned with the outlet plenum (54) of the fluid manifold (50).

The various components (31, 32, and 33) of the micro channel cooler assembly (30) serve different functions but collectively provide coolant flow path through the micro channel cooler assembly (30) from the inlet port (34) to the outlet port (35). For example, the micro channel cooler (31), which is directly bonded to the IC chip (12), includes a plurality of parallel, microscopic heat conducting fins which define a plurality of flow channels for the flow of a coolant (e.g., water) through the channels where heat removal is achieved by thermal contact between the fins and the coolant fluid that flows through the channels forming a fluid connection. The micro channel cooler (31) may be implemented using various frameworks to achieve desired cooling properties, as is understood by those of ordinary skill in the art. For example, micro channel cooler (31) may be formed using the methods described in U.S. Pat. No. 7,139,172, issued Nov. 21, 2006, entitled "Apparatus and Methods for Micro channel Cooling of Semiconductor Integrated Circuit Packages", which is commonly assigned and fully incorporated herein by reference. The micro channel cooler (31) may have an exemplary framework as discussed below with reference to FIGS. 5A~5E, for example.

The manifold plate (32) is designed having fluid supply/return channels for delivering coolant fluid to/from integrated micro channel cooler device (31). FIGS. 6A~6E schematically illustrate one exemplary framework for implementing the manifold (32). Moreover, the manifold (32) may be constructed using methods and frameworks as described in the above incorporated U.S. Pat. No. 7,139,172. For purposes of providing mechanical compliance, a mechanically compliant gasket/seal (36) is provided between the fluid distribution manifold (32) and micro channel cooler device (31) to seal the junction between such components. The mechanically compliant gasket (36) may comprise any suitable compressible material, such as elastomer, or any other suitable material that can be compressed when coupling the coolant deliver manifold (32) to the micro channel cooler (31) while tolerating differences in height of the integrated circuit chips, and without requiring large pressures which can damage the chip (12). The compliant gasket material (36) may also be adhered or bonded to the micro channel cooler (31) and the fluid distribution manifold (32) so that it need not be maintained in a compressed state to form a fluid seal.

The manifold (32) comprises fluid inlet and outlet openings on a top surface thereof, which are aligned to the inlet (34) and outlet (35) openings exposed on the bottom surface of the positioning member (33), wherein O-rings are used in the interface between the manifold (32) and positioning member (33) to seal the fluid inlet/outlet openings (as will be explained in further detail with reference to the exemplary embodiment of FIG. 2). The positioning member (33) is fixedly secured to the inner walls of the aperture of the heat conducting plate (40) and serves to provide an appropriate compressive force to the O-rings and gasket (36) to provide a water tight seal for the coolant flow path at the interface between the manifold (32) and positioning member (33) and the interface between the manifold (32) and micro channel cooler (31). As explained below, the positioning member (33) is adjustable secured to the heat conducting plate (40) to allow for variations in chip thickness, height variations of the micro solder balls used to attach the chips to the substrate, and other chip tilt and vertical tolerances.

The cooling module (20) provides an exemplary framework to realize high-performance cooling of a plurality of chips (e.g., chips 12 and 13) that are mounted on a common substrate (e.g., chip carrier 11), but which have different cooling requirements. For illustrative purposes, in FIG. 1, it may be assumed that the IC chip (12) is a chip (e.g., processor chip) that requires a very low thermal resistance to ambient to meet cooling requirements with regard to high-power density, required junction temperature, hot spot power density, or a combination thereof, whereas the chip (13) is a chip (memory chip) having lower cooling requirements than the IC chip (12).

In the exemplary framework of FIG. 1, a low thermal resistance framework to cool the chip (12) is realized by using the micro channel cooler assembly (30) with the micro channel cooler device (31) thermally bonded to the chip (12) (using a low thermal resistance rigid/semi-rigid bond material) and circulating liquid coolant through the micro channel cooler assembly (30). The cooling requirements of the chip (13) are met by thermally coupling the backside of the chip (13) to the heat conducting plate (40) using a mechanically compliant thermally conductive material such as a thermal paste or grease, and using the heated fluid output from the micro channel cooler assembly (30) via the outlet port (35) to cool regions of the heat conducting plate (40) disposed over the chip (13). Essentially, the heat conducting plate (40) acts as a thermal spreader which conducts the heat generated by the chip (13) to the liquid coolant flowing in the outlet plenum (54) of the fluid manifold (50) mounted on the top surface of the heat conducting plate (40).

More specifically, in FIG. 1, liquid coolant enters the manifold inlet port (51) and flows through the inlet plenum (53) to the inlet (34) of the micro channel cooler assembly (30). The liquid coolant circulates through the micro channel cooler assembly (30), absorbs heat from the backside of IC chip (12), and the liquid coolant is output from the micro channel cooler assembly (30) through the outlet (35) into the outlet plenum (54) of the fluid manifold (50). As the liquid coolant flows/circulates through the outlet plenum (54) to the fluid outlet port (52), the liquid coolant is further heated by absorbing heat from the (top) surface regions of the heat conducting plate (40) aligned with the chip (13). In this regard, heat generated by the IC chip (13) thermally conducts through the thermal bond TB2 to the bottom surface of the heat conducting plate (40) and towards the upper surface of the heat conducting plate (40) where the heat is absorbed by the liquid coolant flowing in the outlet plenum (54). The liquid coolant is output from the fluid manifold (50) through the outlet port (52).

In general, the effective thermal resistance for heat conduction from the chip (12) to the coolant depends on various factors such as the thickness of the chip (12), the structure/design of the micro channel cooler assembly (30), the type and thickness of the bonding material used to join the base of the micro cooler (31) to the chip (12), etc. When the micro channel cooler (31) is formed of silicon or other materials having a CTE that matches the CTE of the material forming the IC chip (12), the thermal bond TB1 may be formed of a material providing a rigid or semi rigid thermal bond to achieve a very low thermal resistance bond between the chip (12) and micro channel cooler (31). The rigid bonding material may comprises any suitable material with low thermal resistivity, such as a solder, metal layer, Ag epoxy, or a filled polymer, to thereby allow sufficient heat conduction from the chip (12). A low thermal resistance bond such as a metal joint, solder joint, or a filled thermal adhesive such as a Ag epoxy, or other joining means could be used, as long as the bonding thickness is sufficiently thin and compatible with the cooling requirements. Further, in some cases, it is desirable that the thermal bond (TB1) is reworkable so that the micro channel cooler (30) can be removed from the chip (12), when needed, to either replace the micro channel cooler device (30) or replace the chip (12).

On the other hand, if the micro channel cooler (31) is not formed of a material that is thermal expansion matched to the chip (12), a low thermal resistance bond may be formed using a semi-rigid or compliant TIM layer formed with a flexible filled polymer, filled thermal pastes, or filled thermal greases. For example, the micro channel cooler may be formed of a metallic material such as copper, or metallic micro channel cooler devices made of copper with a base (e.g., ceramic AlN base) having a CTE that is closely matched to the CTE of the material of the chips.

In general, the effective thermal resistance for heat conduction from the chip (13) to the coolant depends on various factors such as the thickness of the chip (13), the type and thickness of the material forming the heat conducting plate (40), the type and thickness of the thermal interface material used between the base of the cooling plate (40) and the chip (13), and the type and cooling conditions of the coolant flow through the manifold (50), etc. The heat conducting plate (40) may be any thermally conductive device that is typically used in multi-chip packages to dissipate heat that is generated by the semiconductor chips. For example, the heat conducting plate (40) may be any one of known devices generally referred to as thermal hats, thermal caps, package lids/caps/covers, heat spreaders, etc., which are used for constructing chip packages. The heat conducting plate (40) may be formed of, e.g., metal, or other materials with a high thermal conductivity, such as copper (Cu) or aluminum (Al), having different coefficients of thermal expansion as that of the chip material (e.g., silicon). Although not specifically depicted in FIG. 1, the package (10) may include a substrate base ring that surround s the package substrate (11) to provide means for mounting the substrate (11) containing the chips (12, 13) to a PCB (or other second level package) and to the heat conducting plate (40). The substrate (11) would be fixedly attached to the base ring with the heat conducting plate (40) being bonded to the substrate (11) using an adhesive, or other means, around the perimeter of the substrate (11) in such a way as to form a hermetically, or nearly hermetically, sealed region to protect the chips (12) and (13) from exposure to moisture and the ambient.

Furthermore, the thermal bond $TB_2$ may be formed using any suitable mechanically compliant thermally conductive material that is suitable for the given application, including, for example, thermal pastes, thermal greases, or thermally conductive fluids such as oils. Thermally conductive pastes typically comprise thermally conductive particles having a distribution of sizes dispersed within a binder material or matrix, such as the thermal pastes described in U.S. Pat. No. 5,098,609, entitled "Stable High Solids, High Thermal Conductivity Pastes", which is incorporated herein by reference. Typical thermal interface materials (TIMs) include those having a wax matrix, commonly known as phase-change materials, those having a silicone-based matrix, and dry particle lubricants such as graphite and metal powders. Less viscous thermally conductive materials, such as oils, have a lower thermal conductivity than pastes, but can also be applied in much thinner layers, resulting in improved thermal performance, but less mechanical compliance. Other possible thermally conductive compliant materials that may be used include those described in the above incorporated U.S. Pat. No. 5,098,609, which provide high thermal conductivity, and high viscosity (where the fraction of the material which is composed of solids is very high) thermal interface materials.

It is to be understood that FIG. 1 is a high level conceptual illustration of an exemplary framework in which a common fluid distribution manifold is used to feed coolant to one or more micro channel coolers to cool chips which require a very low thermal resistance mounted on a multi-chip module (MCM), while using heated outlet fluid from the micro channel coolers to cool regions of a heat conducting plate over remaining chips on the MCM which are coupled to the heat conducting plate using a compliant TIM layer such as a thermal paste or grease. The exemplary architecture of FIG. 1 can be realized with varying frameworks to meet various cooling requirements for different chips mounted on a common substrate, based on the given application. For example, FIG. 2 schematically illustrates an electronic module according to an exemplary embodiment of the invention, which is based on the conceptual framework discussed above with reference to FIG. 1. In general, FIG. 2 is a schematic exploded view of an electronic module (100) comprising a multi-chip module (110) and common cooling module (120). The multi-chip module (110) includes a plurality of chips (112) and (113) formed on a chip carrier (111). The cooling module (120) generally comprises a plurality of micro channel cooler assemblies (130), a heat conducting plate (140) (or thermal hat) and fluid manifold (150).

In the illustrative embodiment, the chip carrier (111) includes four chips (112) arranged in a 2×2 array in the center region of the chip carrier substrate (111) and four chips (113) arranged around the inner array of chips (112) such that each chip (113) is located near corner regions of the chip carrier substrate (111). In one exemplary embodiment, the chip carrier (111) may be a ceramic wiring substrate ($1^{st}$ level package), wherein the chips (112) are high-performance processor chips and the chips (113) are cache memory chips, and wherein the substrate (111) comprises numerous decoupling capacitors (114) attached to the top surface. For illustrative purposes, it is assumed that the four processor chips (112) located in the center region of the wiring substrate (111), require a much lower thermal resistance than the cache memory chips (113) due to higher power densities and hot spots. The common cooling module (120) is designed to meet disparate cooling requirements of the chips (112) and (113).

To achieve a very low thermal resistance for cooling the high-performance chips (112), each micro channel cooler assembly (130) is thermally bonded to the backside surface of a corresponding one of the chips (112). Each micro channel cooler assembly (130) comprises a micro channel cooler (131), micro channel manifold plate (132), and positioning element (133). The micro channel cooler (131) may be formed of Si (or any material CTE matched to the chip material). When formed of material (e.g., Si) CTE matched to the material of the chips (112), the micro channel coolers (131) can be rigidly bonded to the backsides, or inactive surface, of chips (112) using a low thermal resistance bonding material ($</=10$ C-mm$^2$/W) such as an Ag epoxy, filled polymer, metal or solder layer. For example, an Ag epoxy, with a bond line of about 0.0005 inches, can have a unit resistance of about 7 C-mm$^2$/W and a thin In layer (<0.1 mm) can have a unit resistance of about half that value. An exemplary embodiment of the micro channel cooler (131) will be described below with reference to FIGS. 5A~5E.

The manifold plate (132) comprises a single inlet (132a) and single outlet (132b) on a top surface thereof, which translates into multiple alternating inlet and outlet slots on a bottom surface thereof, which are aligned to fluid inlet/outlet vias on the top surface of the micro channel cooler (131) opposite the bottom surface which is bonded to the chips (112). An exemplary embodiment of the manifold plate (132) will be described in detail below with reference to the illustrative embodiment of FIGS. 6A~6E. The manifold plate (132) is coupled, through a flexible cooler gasket, to the micro channel cooler (131). The manifold plate (132) is coupled to the positioning member (133) using O-rings that are inserted in recessed channels R1 and R2 surrounding the inlet and outlet holes (132a) and (132b), respectively, wherein the inlet and outlet holes (132a) and (132b) are aligned to the openings of the inlet and outlet (134) and (135) exposed on the bottom surface of the positioning member (133).

The thermal hat (140) is essentially a planar square/rectangular-shaped package cover having upper and lower surfaces (140a) and (140b), and a plurality of apertures (141) formed through the thermal hat (140) in a central region thereof. The apertures (141) are sized, shaped, and arranged to insertably receive each of the micro channel cooler assemblies (130) when the thermal hat (140) is mounted to the substrate (111) and thermally coupled to the chips (113) for heat removal. The thermal hat (140) also contains provisions for attachment to a support ring (not shown) in which the MCM (110) would be mounted. The thermal hat (140), in combination with the support ring and substrate (111) would form a semi-hermetically sealed environment to protect the chips (112), (113), using assembly techniques well known in the art.

Figure 2:
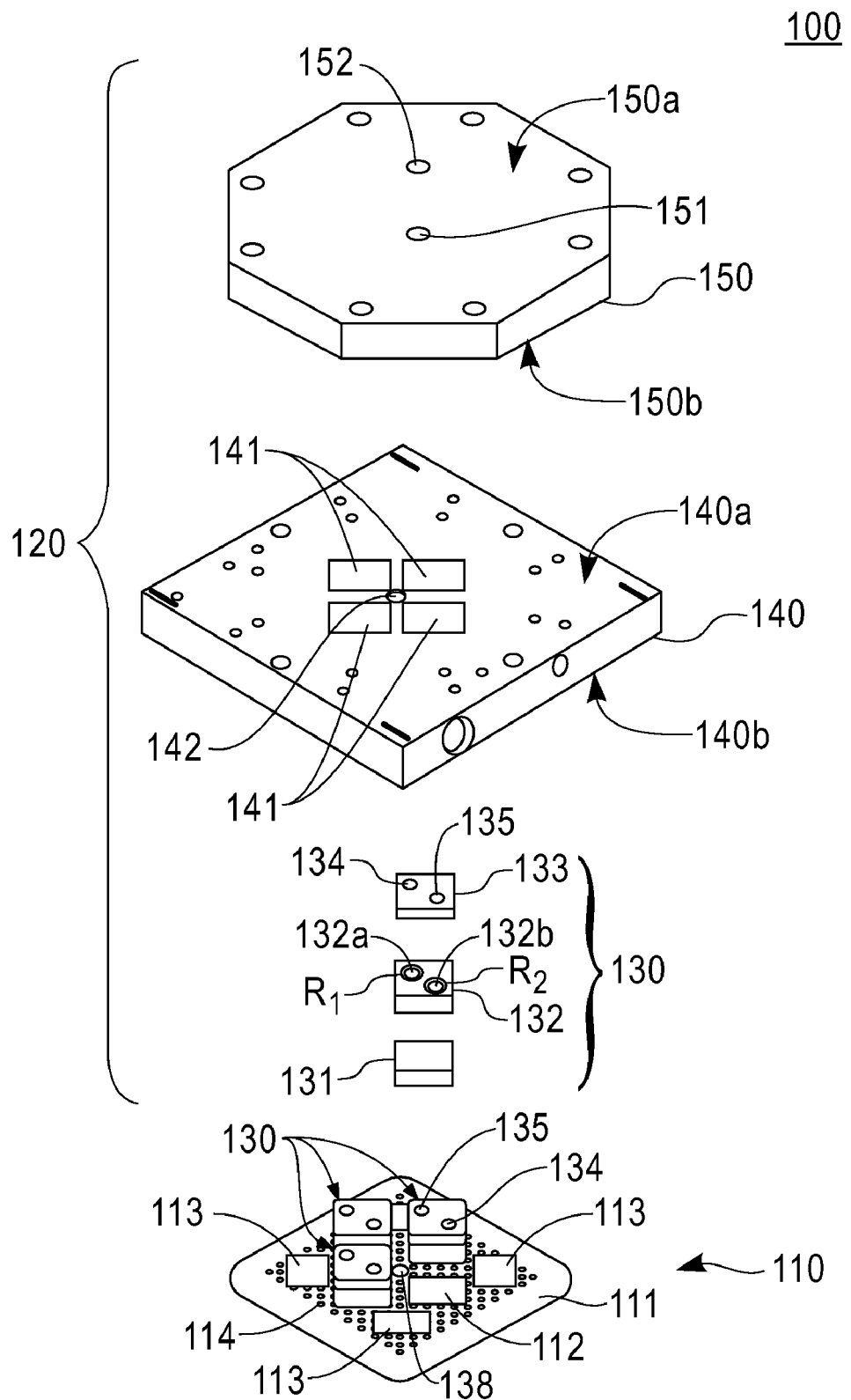
FIG. 2 is an exploded schematic view of an electronic module according to an exemplary embodiment of the invention, which provides high-performance liquid cooling of a multi-chip module having multiple IC chips with disparate cooling requirements.
Figure 3:
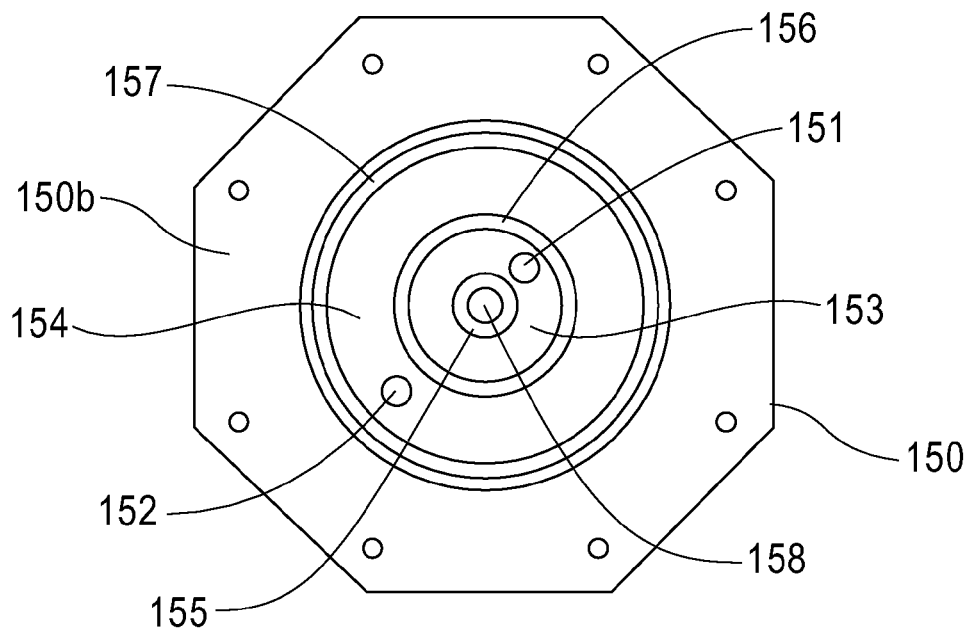
FIG. 3 is schematic plan view of the bottom surface of a fluid manifold according to an exemplary embodiment of the invention.

The fluid manifold (150) is shown in FIG. 2 as an octagon-shaped planar element having upper and lower surfaces (150a) and (150b). The fluid manifold (150) comprises a fluid inlet port (151) and a fluid outlet port (152), which is illustrated in FIG. 2 as openings in the upper surface (150a) of the manifold (150). The fluid inlet port (151) and the fluid outlet port (152) provide openings to an inlet plenum (153) and outlet plenum (154), respectively, formed on the bottom surface (150b) of the fluid manifold (150), as illustrated in FIG. 3. In particular, FIG. 3 is schematic plan view of the bottom surface (150b) of the fluid manifold (150) shown in FIG. 2, where the inlet and outlet plenums (153) and (154) are essentially circular channels that are formed on the bottom surface (150b). The inlet plenum (153) is essentially a circular fluid inlet distribution channel that is aligned to the fluid inlet port (151). The outlet plenum (154) is essentially a circular fluid outlet distribution channel that is aligned to the fluid outlet port (152), and which concentrically surrounds the inlet plenum (153).

The fluid manifold (150) contains three concentric o-ring channels (155), (156) and (157) for receiving sealing O-rings that are used as fluid sealing mechanisms when the manifold (150) and thermal hat (140) are fixedly coupled via a compression actuation system (i.e. eight screws around the perimeter of the fluid manifold (150)). An inner most o-ring channel (155) is formed to insertably receive an O-ring that is used to prevent the coolant fluid from leaking into a central region (158) thereof which is above a load screw in the thermal hat (140) that is used to assemble the module (100). The middle O-ring channel (156) is formed to insertably receive an O-ring that serves to prevent coolant fluid from leaking between the inlet plenum (153) and outlet plenum (154). The outer O-ring channel (157) is formed to insertably receive an O-ring that serves to prevent fluid from leaking out from the outlet plenum (154).

A threaded hole (142) is provided in the thermal hat (140) for the load screw which is adjusted to provide a uniform load to a LGA which is used for electrically connecting the electronic module (100) to a printed circuit board (not shown). A circular metal part (138) is attached to the center of the wiring substrate (111) where the load screw (not shown) bears on the wiring substrate (111). The thermal hat (140) also contains provisions for attachment to a support ring (not shown) in which the MCM would be mounted. The thermal hat (140), in combination with the support ring and ceramic wiring substrate (111), forms a semi-hermetically sealed environment to protect the chips.

To assemble the module (100), the micro channel cooler (131), gasket, and manifold (132) are assembled together, with an adhesive if so desired, and leak tested. Next, the location of the positioning members (133) are fixed by performing a "dry" assembly where a metal shim, equal in thickness to the final TIM layer thickness, is placed on chips (113), the thermal hat (140) is aligned with and placed over the substrate (111) along with the support ring (not shown). Then additional shims, with a thickness equal to the final TIM layer thickness, are placed on chips (112), the micro channel cooler (131), thin flexible gasket, manifold (132), assembled together and positioning members (133) are placed in the apertures (141) in the thermal hat without any o-rings between the manifolds (132) and the positioning members (133).

This assembly is than passed through a reflow oven to fix the positioning members in place by using solder or other hermetic rigid joining means. The orientation and location of the different parts are noted and retained when the structure is reassembled. The parts are then disassembled and the top surface of the thermal hat (140) is fly-cut flat; the positioning members are designed to protrude slightly above surface (140a) initially. The shims are all removed from the chips. The backside surfaces of the chips (113) are coated with a layer of mechanically compliant, thermally conductive material.

A semi-hermetic adhesive is dispensed around the perimeter of the substrate (110) or of the thermal hat (140). The backside surfaces of the chips (112) are coated with a layer of a rigid thermally conductive material such as silver filled epoxy or solder. The assembly of the micro channel cooler (131), gasket, and manifold (132), along with their o-rings, are inserted into the appropriate apertures (141) in the bottom surface of the thermal hat (140). The thermal hat (140) is mounted over the substrate (110) such that the cooler and manifold stacks (131,132) are inserted into the respective apertures (141) and such that the bottom surface (140b) of the thermal hat contacts the compliant thermal conductive material on the chips (113). The positioning elements (133) in the thermal hat (140) serve to compress the o-rings on the chip manifolds (132) and compress the gasket between the micro channel coolers (131) and manifolds (132).

The thermal hat (140) and substrate (111) are incrementally compressed together via an actuation mechanism so as to achieve a desired thickness of the layer of complaint thermally conductive material between the thermal hat (140) and the chips (113) and to achieve a desired thickness of the layer of rigid thermal conductive material between the micro channel cooler (131) and the chips (112). These materials may then be cured if needed. The use of the positioning member (133) enables a thin and uniform TIM thickness despite the variations in chip thickness, the height variations of the micro solder balls used to attach the chips to the wiring substrate, and other tolerances, using techniques such as described in U.S. Pat. No. 6,404,638 to Messina, entitled "Small Gaps Cooling Technology", which is commonly assigned and incorporated herein by reference.

Figure 4:
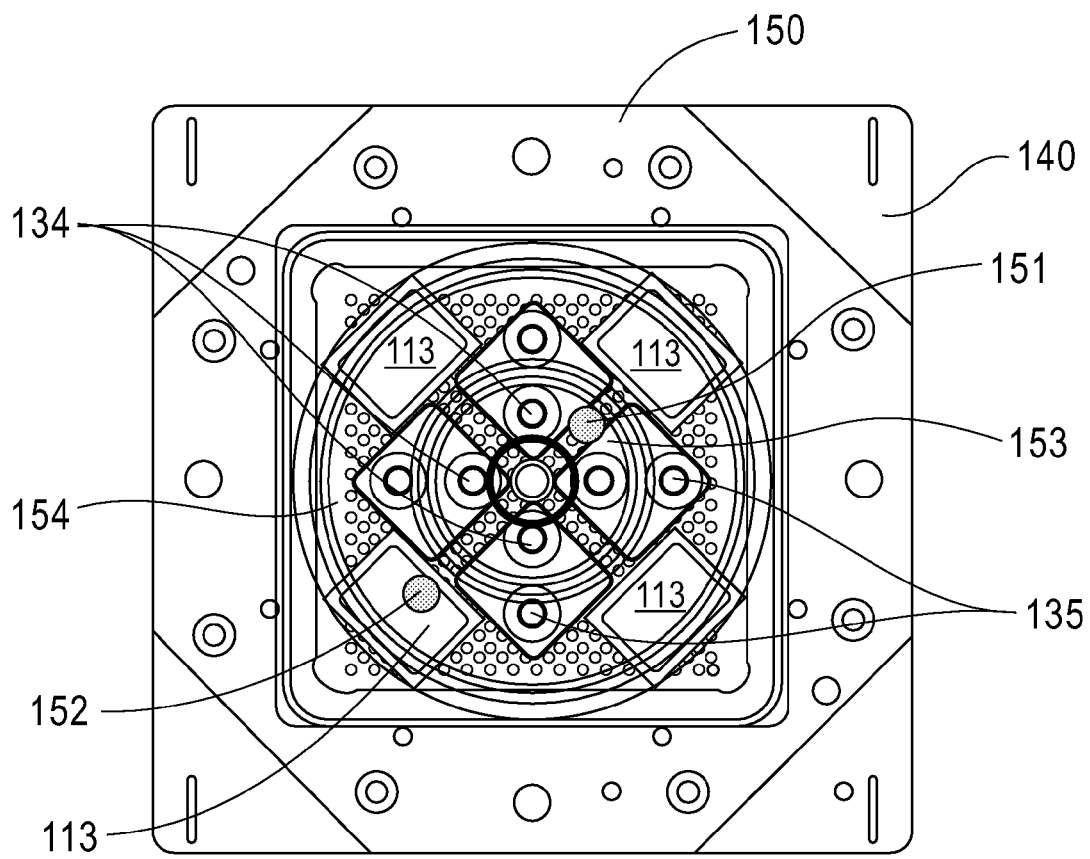
FIG. 4 is a schematic phantom top plan view of the exemplary embodiment of FIG. 2.

FIG. 4 is a top plan view of the electronic module (100) when assembled. FIG. 4 is a schematic phantom view illustrating an alignment of the fluid inlet/outlet plenums (153, 154) of the manifold (150) with the inlet and outlet ports (134, 135) of the positioning members (133) of the micro channel cooler assemblies (130) mounted on top of the inner array of chips (112). In particular, as shown in FIG. 4, the annular inlet plenum (153) is arranged to align with each of the inlet holes (134) of the positioning members (133) such that inlet holes (134) are fed with coolant fluid that is input via the single inlet (151) on the top surface of the manifold (150). Moreover, the annular outlet plenum (154) is arranged to align with each of the outlet holes (135) of the positioning members (133) such that the outlet holes (135) feed heated coolant into the outlet plenum (154) which flows out of the micro channel cooler assemblies (130). FIG. 4 further illustrates the alignment of the outlet plenum (154) of the manifold (150) over the thermal hat (140) above the backside surfaces of the chips (113) mounted on the substrate (110).

In view of FIG. 4, the cooling module (120) assembly of FIG. 2 provides a coolant flow path between the inlet port (151) and outlet port (152) of the manifold (150), whereby coolant flows into the inlet plenum (153) and is distributed to each of the inlet ports (134) of the positioning members (133), where the coolant flows into the inlet holes (134) through the o-ring sealed openings (132a) of the manifold (132) into a manifold inlet zone and into the inlet vias of the micro channel coolers (131). After circulating through the micro channel cooler (131), heated coolant flows out of the micro channel cooler (131) into manifold outlet zones of the manifold (132), and then out through the O-ring sealed outlets (132b) and positioning member outlet holes (135) into the manifold outlet plenum (154). The heated coolant output from each of the micro channel cooler assemblies (130) flows through the outlet plenum (154) where the heated coolant absorbs heat from the surface regions of the thermal hat (140) aligned to the chips (113), and then flows out of the assembly via the outlet port (152). The heated coolant is then cooled and re-circulated to the inlet portion (151), using known systems and techniques.

In the exemplary embodiment, the cache memory chips (113) are cooled via thermal conduction from the bottom surface (140b) (to which the chips (113) are thermally bonded) to the top surface (140a) of the thermal hat (140), where the heat is absorbed by the coolant flow in contact to the top surface (140a) of the thermal hat (140). Again, the cache memory chips (113) are thermally bonded to the bottom surface (140b) of the thermal hat (140) using a mechanically compliant thermal conductive material that will not transfer a shear force between the thermal hat (140) and the cache chips (113) during thermal cycling. Moreover, by arranging the chips (112) in the central region of the substrate (111) and thermal hat (140), where the center point of the package (100) may be considered a "neutral stress point", the difference in relative thermal expansion between the substrate (111) and the thermal hat (140) in radial directions from the center point is minimized so as to minimize the stress on the thermal joint between chips (112) and the thermal hat (140).

Figure 5A:
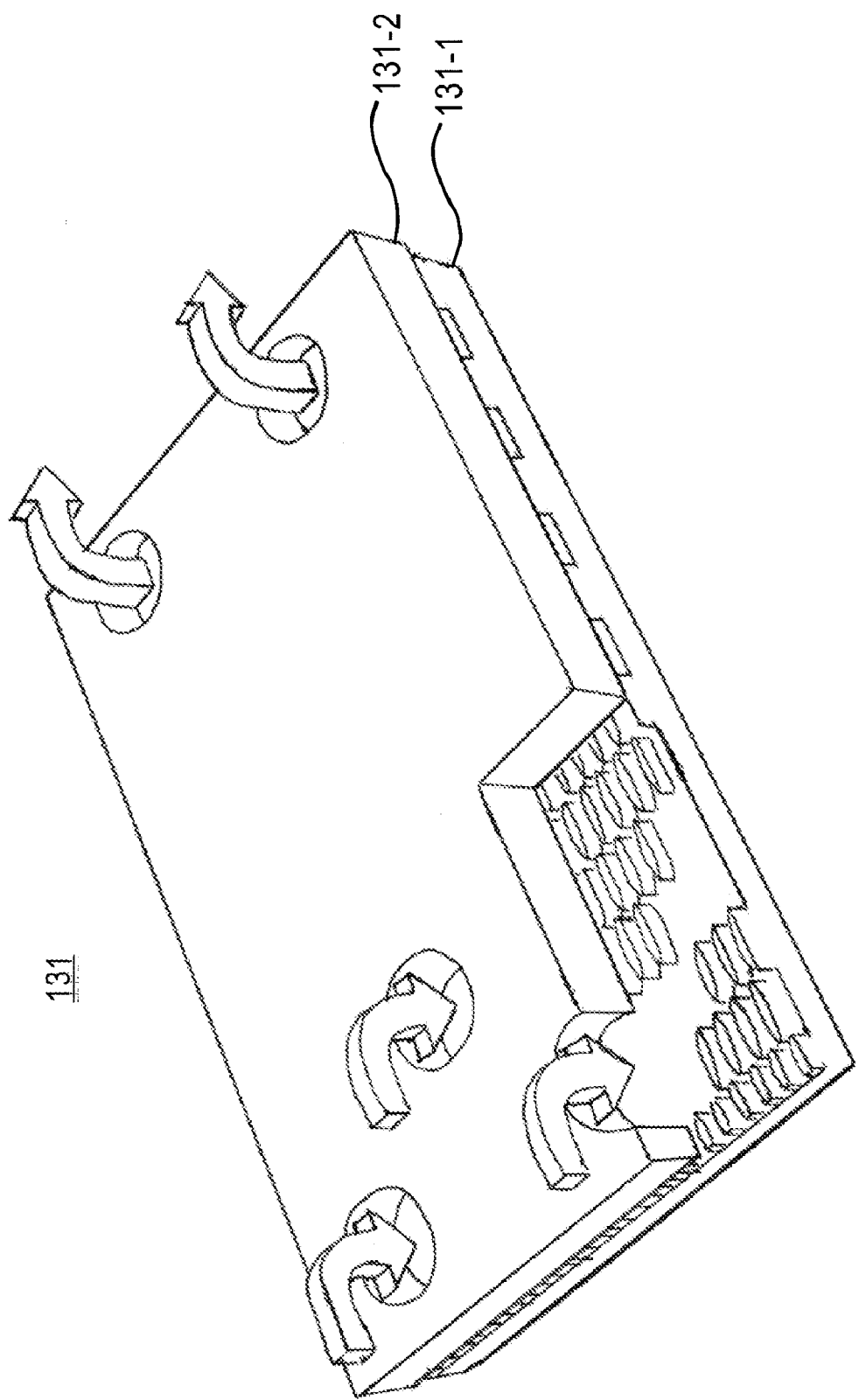
FIGS. 5A~5E are schematic views of a micro channel cooler device according to exemplary embodiments of the invention.

It should be noted that the micro channel coolers (131) of FIG. 2 may be formed to have a wide range of frameworks as required to meet specific cooling requirements of the chips. FIGS. 5A~5E are schematic illustrations of exemplary embodiments of micro channel coolers which may be fabricated using methods described in the above incorporated U.S. Pat. No. 7,139,172. In particular, FIG. 5A is a three-dimensional perspective view of an exemplary embodiment of a silicon micro channel cooler, which may be used as the micro channel cooler (131) in the exemplary embodiment of FIG. 2. In general, the micro channel cooler (131) includes a manifold plate (131_2) bonded to a corresponding micro channel plate (131_1). FIGS. 5A, 5B, 5C and 5D schematically illustrate an exemplary embodiment of the manifold plate (131_2) in detail, while FIG. 5E schematically illustrates an exemplary embodiment of the micro channel plate (131_1), as described in the above-incorporated U.S. Pat. No. 7,139,172.

Figure 5B:
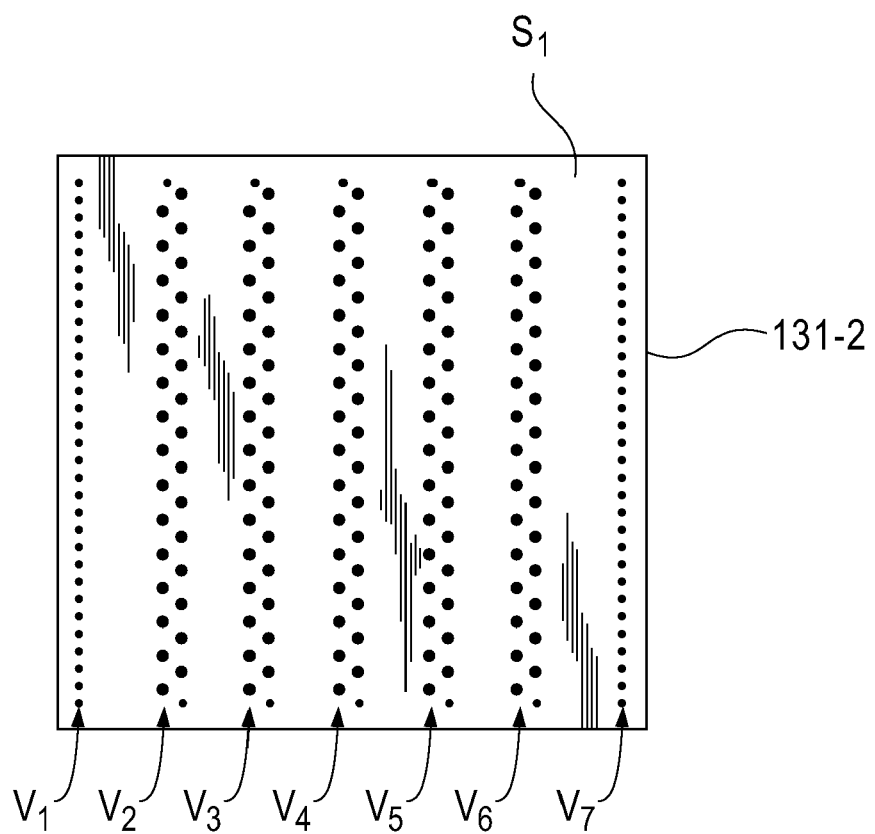
Figure 5C:
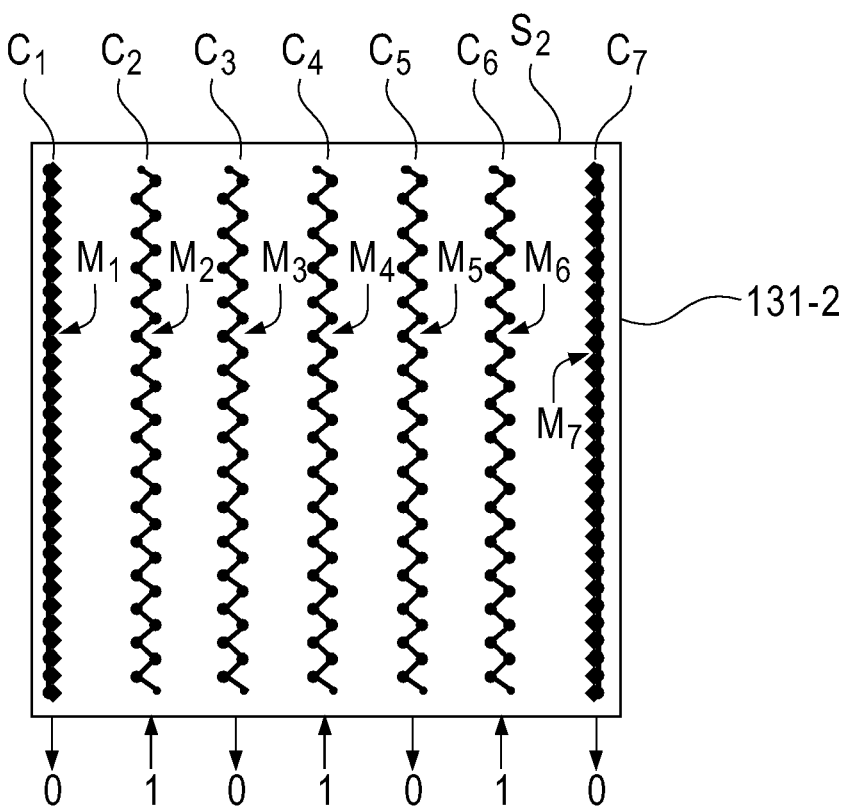

FIGS. 5B and 5C are top and bottom plan views, respectively, of the exemplary manifold plate (131_2) formed of a planar silicon substrate. In FIG. 5B, a top surface S1 includes patterns of vias (V1~V7), or generally Vi, formed on the surface S1 of the substrate. Each via patterns (V1) and (V7) comprise a series of circular openings that are arranged in a linear pattern, and each via pattern (V2)~(V6) comprises a series of circular openings arranged in a zigzag pattern. Each via pattern Vi comprises a plurality of openings that serve as fluid inlets/outlets to corresponding inlet/outlet manifold channels (Ci) that are formed on the opposing surface (S2) of the substrate, as shown in FIG. 5C. As shown in FIG. 5C, the manifold plate (131_2) comprises a plurality of fluid manifolds (M1~M7) (or denoted generally, Mi) formed on a bottom surface (S2). Each fluid manifold (M1~M7) comprises a corresponding manifold channel (C1~C7) (or more generally, Ci), wherein the fluid vias of corresponding fluid via patterns (V1~V7) form openings which extend from the surface (S1) to various points along the corresponding manifold channels (C1~C7).

Figure 5D:
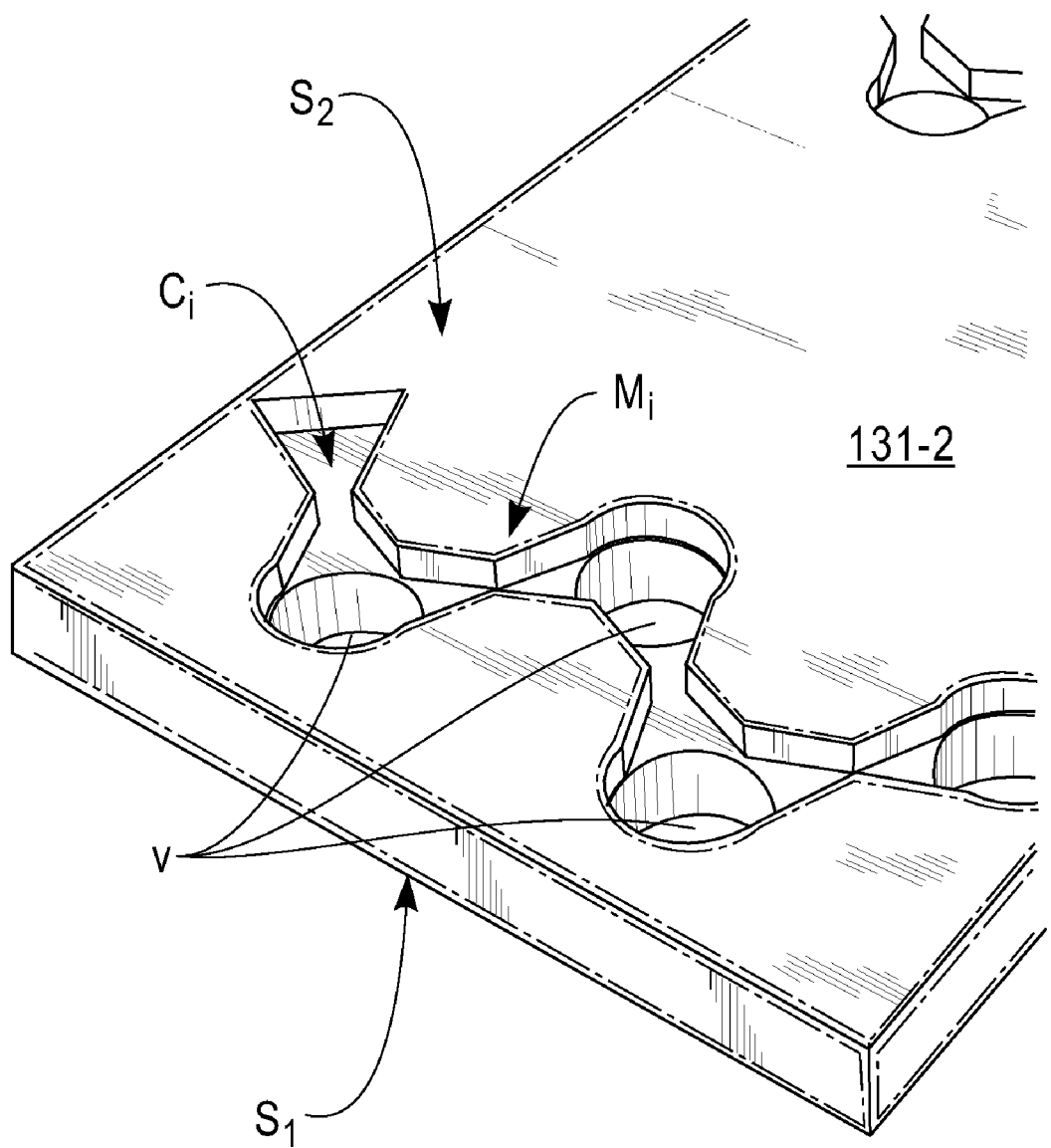
Figure 5E:
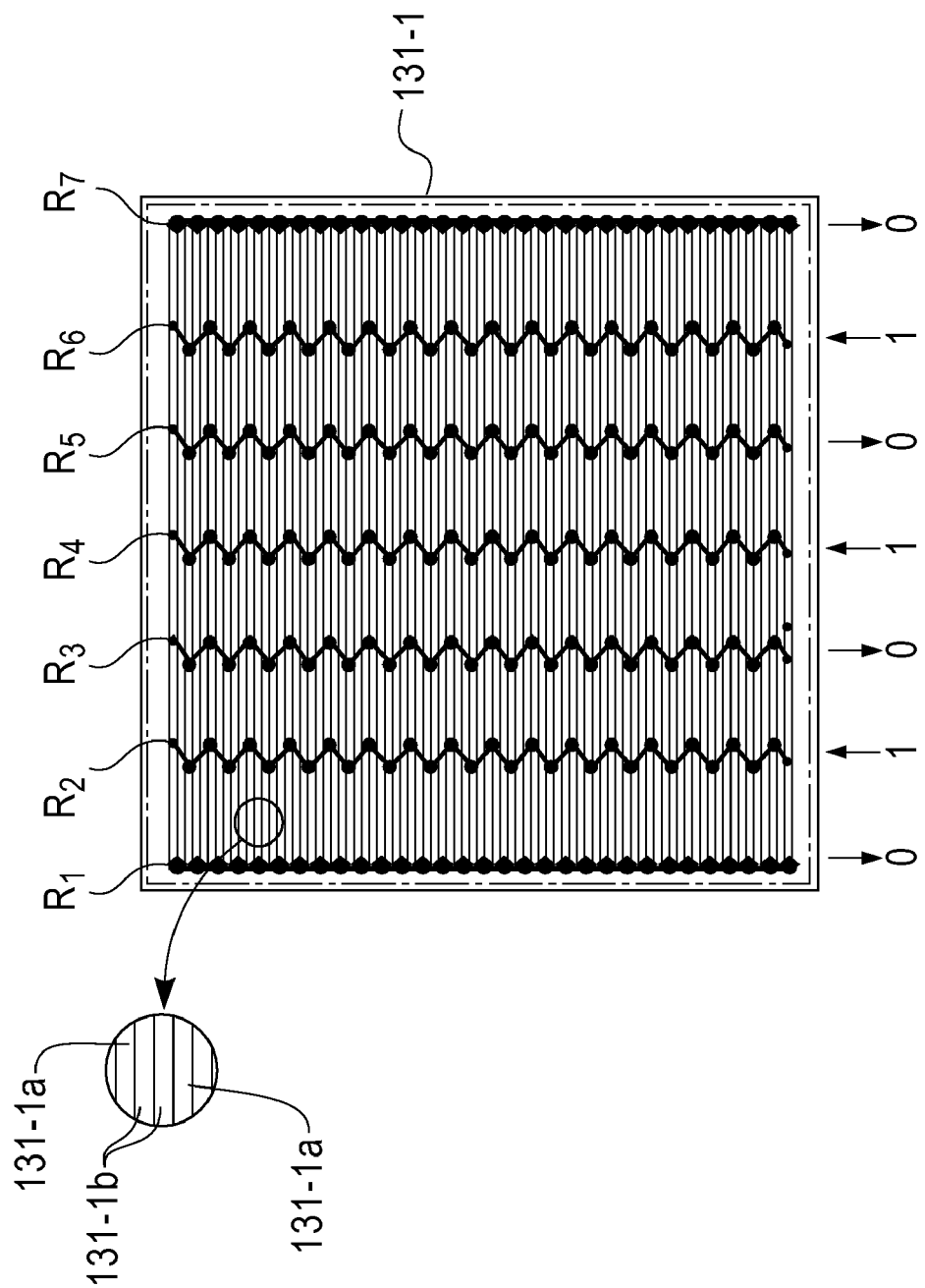

FIG. 5D is a perspective view of a portion of the manifold plate (131_2) illustrating a manifold channel (Ci) formed in the surface (S2) of the substrate, which comprises a continuous cavity that is patterned and recessed to a depth that is sufficient to connect to each fluid via (v) of a corresponding pattern of fluid vias (Vi) on the surface S1.

FIG. 5E is a schematic diagram illustrating a exemplary embodiment of the micro channel plate (131_1), which comprises a silicon substrate that is etched to form a plurality of parallel thermal micro fins (131_1a) which define micro channels (131_1b). The micro fins (131_1a) are not continuous, but are discontinuous at recessed regions (R1~R7) which correspond to, and are aligned with, corresponding manifold channels C1~C7 (FIG. 5C) when the manifold plate (131_2) is bonded to the micro channel plate (131_1) to form an integrated micro channel cooler device (131). The recessed regions (R1~R7) act as manifolds in conjunction with the corresponding manifold channels (C1~C7) of the manifold plate (131_2) to increase the area available for the distribution of fluid that flows from the fluid vias (v) to the micro channel (for inlet manifolds) and for the distribution of fluid that flows from the micro channels to the fluid vias (for outlet manifolds).

An exemplary micro channel cooler assembly constructed using the exemplary components (131_1) and (131_2) in FIGS. 5B, C and E) includes six heat exchanger zones formed between alternating inlet and outlet manifolds, as indicated by "I" and "O" in FIG. 5E. Indeed, referring to FIGS. 5C and 5E, six heat exchanger zones are defined by alternating inlet and outlet manifolds, wherein each inlet manifold (M2, M4 and M6) feeds two zones of micro channels that end at outlet manifolds (M1, M3, M5 and M7). This results in the micro channel cooler being divided into six parallel-fed heat exchanger zones with reduced flow length between the inlets and outlets. The manifold (131_2) and micro channel plate (131_) can be bonded to provide a watertight seal (but the bond does not have to provide a low thermal resistance). Accordingly, bonding methods such as direct wafer bonding, fusion bonding, anodic bonding, glass frit bonding, solder bonding, polymer adhesive bonding, or any other suitable bonding method may be used to join the micro channel and manifold plates (131_1) and (131_2).

Figure 6A:
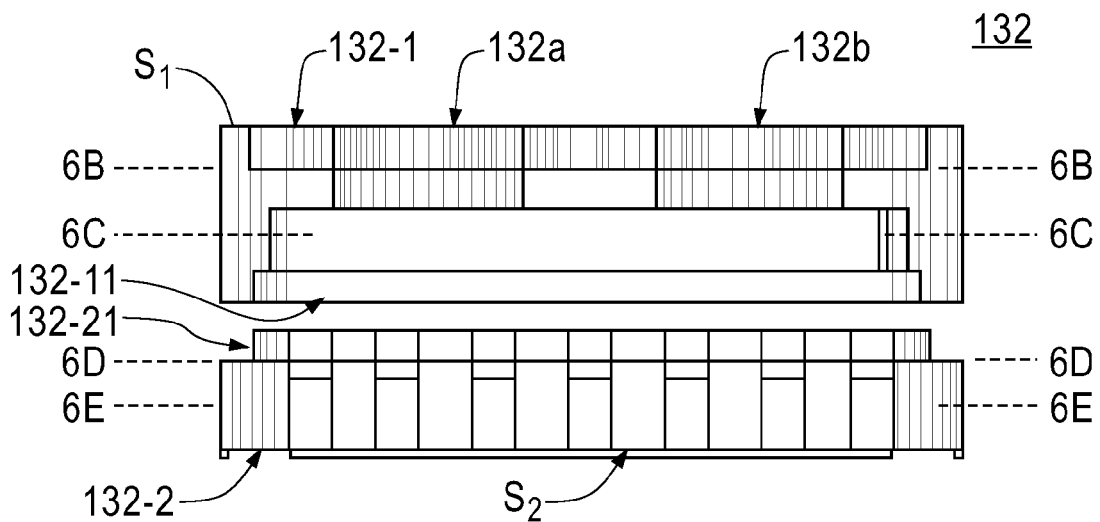
FIG. 6A~6E are schematic views of a micro channel manifold device according to an exemplary embodiment of the invention.
Figures 6B, 6C:
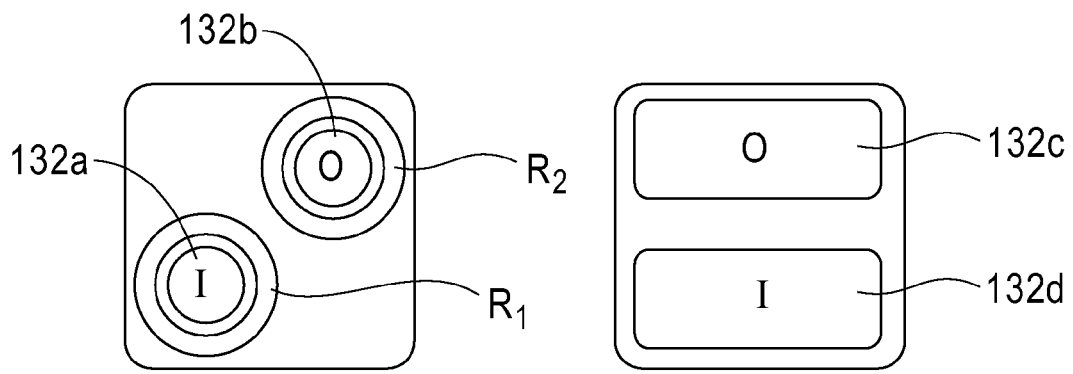
Figures 6D, 6E:
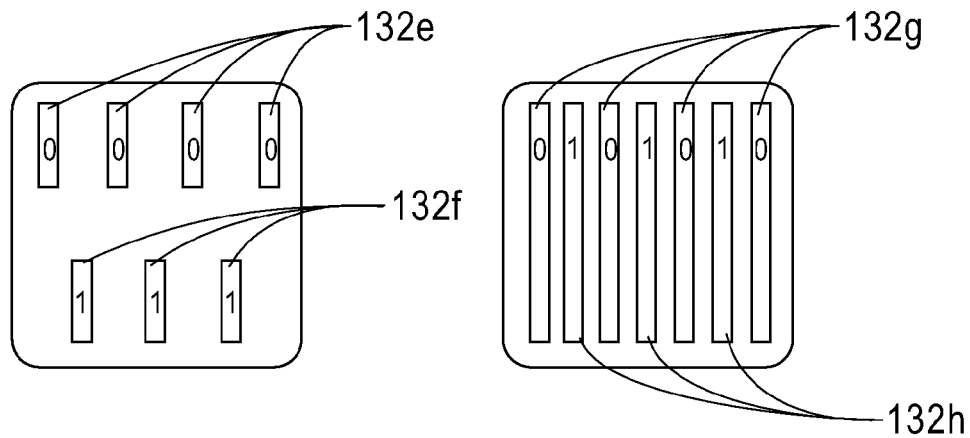

FIGS. 6A~6E schematically illustrate a micro-fluid manifold according to an exemplary embodiment of the invention. In particular, FIGS. 6A~6E schematically illustrate an exemplary embodiment of the micro fluid manifold (132), which may be used with the exemplary micro channel cooler of FIGS. 5A~5E. FIG. 6A is a schematic side view illustration of the manifold (132) comprising a first element (132_1) and second element (132_2), FIG. 6B is a plan view of the manifold element (132_1) at line 6B-6B in FIG. 6A, and FIG. 6C is a plan view of the manifold element (132_1) at line 6C-6C in FIG. 6A. Furthermore, FIG. 6D is a plan view of the manifold element (132_2) at line 6D-6D in FIG. 6A, and FIG. 6E is a plan view of the manifold element (132_2) at line 6E-6E in FIG. 6A.

As illustrated in FIGS. 6A and 6B, an upper surface S1 of the manifold element (132_1) includes the pair of fluid through holes (132a) and (132b) each surrounded by a partially recessed O-ring channel (R1) and (R2), respectively. As illustrated in FIGS. 6A and 6C, the through holes (132a) and (132b) connect to a separate inlet plenum (132d) and an outlet plenum (132c), respectively, which are formed in the manifold element (132_1).

Moreover, as illustrated in FIGS. 6A and 6D, a plurality of manifold outlet vias (132e) and manifold inlet vias (132f) are formed in the second manifold element (132_2). As illustrated in FIGS. 6A and 6E, a plurality of alternating inlet and outlet slots (132h/132g) are formed in a bottom region of the manifold element (132_2). The outlet vias (132e) (FIG. 6D) are aligned to the outlet slots (132g) (FIG. 6E) and the inlet vias (132f) are aligned to the inlet slots (132h).

The first element (132_1) comprises a groove (132_11) formed in a mating surface thereof, which is designed to insertably mate with a tongue element (132_21) formed on the upper surface of the second manifold element (132_2). The manifold elements (132_1) and (132_2) may be separately formed pieces (made of metal, plastic, etc.) that are bonded together after formation of the various via holes, channels, slots, etc. When bonded together, the inlet and outlet plenums (132d)/(132c) (FIG. 6C) formed in the manifold element (132_1) are aligned to the inlet and outlet slot vias (132f/132e) (FIG. 6D) formed in the lower manifold element (132_2).

The bottom surface S2 of the manifold (132) comprises a series of elongated slots as depicted in FIG. 6E, which comprise alternating fluid inlet/outlet openings that are coupled to respective via patterns V1~V7 on the surface S1 of the exemplary micro channel manifold plate (131_2) (FIG. 5B) with a mechanically compliant gasket. For example, in the exemplary embodiment, the fluid outlet slots (labeled "O") in FIG. 6E would each be aligned with and coupled to a corresponding one of the fluid vias patterns V1, V3, V5 and V7 in FIG. 5B to receive heated fluid that is returned from the micro channel cooler device (131), whereas the fluid inlet slots (labeled "I") in FIG. 6E would each be aligned with and coupled to a corresponding one of the fluid via patterns V2, V4 and V6 in FIG. 5B to supply coolant fluid into the micro channel cooler device (131).

It is to be understood that the exemplary embodiments of the micro channel cooler devices and micro channel manifolds described with reference to FIGS. 5A~5E and FIGS. 6A~6E are merely provided for illustrative purposes, and that micro channel cooling assemblies according to exemplary embodiments of the invention may be constructed using various techniques and having various custom designs to achieve the cooling requirements for the chips that are employed. For example, U.S. Pat. No. 7,139,172 describes various exemplary designs for micro channel coolers having micro channels arranged and structured to provide different local cooling capacities.

Moreover, in the exemplary embodiments of FIGS. 1 and 2, the heat conducting device or thermal hats are shown as being essentially planar elements. In other embodiments, the thermal resistance for cooling the lower power memory chips (13, 113) an be reduced by providing narrow channels, or fins, in the thermal hat (40, 140) in the regions over the memory chips (13, 113) and modifying the fluid manifold (50, 150) to direct the coolant flow through said channels to reduce the temperature difference between the coolant and the thermal hat (40, 140). In this exemplary embodiment, the coolant is first directed to the processor chips (12, 112) which require a very low thermal resistance, and then subsequently used to cool the memory chips (13, 113), which do not require a low thermal resistance. Further, if channels are formed in the thermal hat (40, 140) over the memory chips (13, 113), the minimum depth or width of the channels would be greater than the corresponding dimensions of those channels in silicon micro channel coolers (31, 131) that are used for cooling the processor chips (12, 112). In all exemplary embodiments, it is desirable to achieve the minimum fluid flow possible to reduce the size of the plumbing, pump, heat exchanger and other components. Using a smaller fluid flow for a given heat load will result in a larger change in temperature, $\Delta T$ in the fluid, which allows for an increase in the efficiency of the heat exchanger, as well as a reduction in the size of the heat exchanger for a given heat load.

Figure 7A:
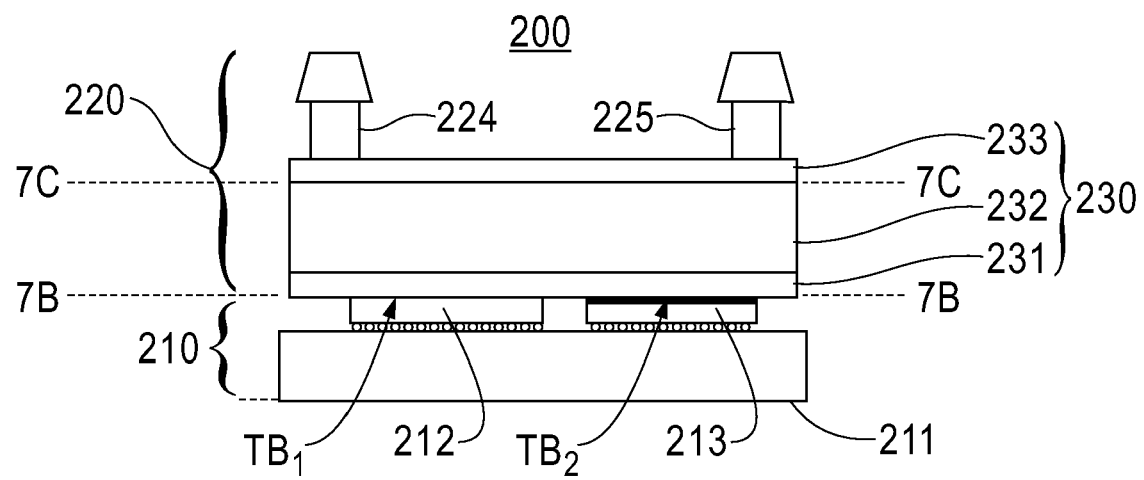
FIGS. 7A~7C are schematic views of an electronic module according to another exemplary embodiment of the invention, which provides high-performance liquid cooling of a multi-chip module having multiple IC chips with disparate cooling requirements.
Figure 7B:
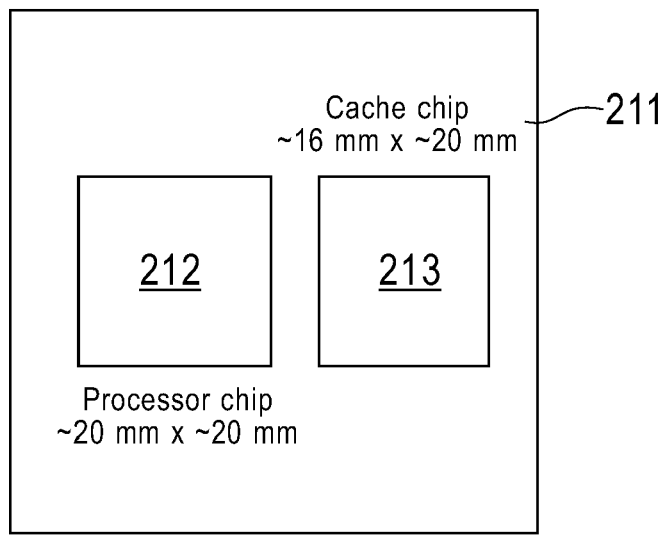
Figure 7C:
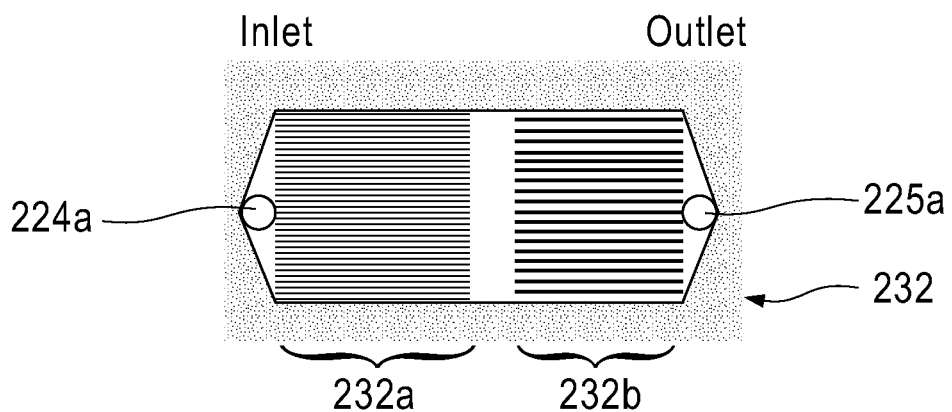

In other exemplary embodiments of the invention, an electronic apparatus having an integrated multi-chip module and common cooling module can be designed using a metallic cooler device (e.g., copper) that is commonly attached to a plurality of chips mounted face down on a common substrate, wherein the cooling module and thermal coupling is designed to provide different thermal resistances to meet the cooling requirements of the chips. For example, FIGS. 7A~7C schematically illustrate an electronic module (200) according to another exemplary embodiment of the invention, comprising a dual-chip module (210) and common cooling module (220). FIG. 7A is a schematic side-view illustration of the exemplary module (200), FIG. 7B is a top plan view taken along line 7B-7B of FIG. 7A, and FIG. 7C is a top plan view taken along line 7C-7C of FIG. 7A.

As illustrated, the dual-chip module (210) includes a pair of chips (212) and (213) flip chip mounted on a chip carrier (211). The cooling module (220) generally comprises a micro channel cooler assembly (230) including a cooler base (231), cooler body (232), and cooler lid (233). A plurality of fluid fittings (224) and (225) are provided, where the fluid fitting (224) provides a fluid inlet port to the micro cooler (230) and where the fluid fitting (225) provides a fluid outlet port of the micro channel cooler assembly (230). For illustrative purposes, it is assumed that chips (212) and (213) are processor and cache chips, respectively, mounted on the substrate (211). It is assumed that the processor chip (212) requires a very low thermal resistance, either due to a high power density, required junction temperature, hot spot power density, or a combination of thereof, wherein the cache chip (213) does not require a low thermal resistance for heat removal. The substrate (211) may be part of a 1st level chip package.

The micro channel cooler (230) may be formed of a metallic material, such as copper, wherein the various components (231), (232) and (233) are separately formed copper components that are assembled together to form the micro channel cooler (230). For instance, the cooler base (231) may be planar copper plate on which patterns of micro channels (formed between a thermal fins) are formed or otherwise mounted on a surface thereof (using known techniques), and where the cooler base (231) is bonded to the body element (232) with the micro channels disposed inside within the interior of the body (232).

FIG. 7C illustrates a first pattern of fine-pitched micro channels (232a) and a second pattern of coarse-pitched micro channels (232b), which may be formed on the base element (231) and disposed within an enclosed inner cavity region of the body element (232). The thermal fins defining the micro channels may extend vertically from the surface of the base (231) to the same height as the sidewalls of the body element (232) or at some height lower than the height of the sidewalls of the body element (232). The cooler lid (233) is bonded to the top of the body element (232), thereby fully enclosing the micro channel patterns (232a) and (232b) within the inner cavity region, and forming a coolant flow path. In particular, fluid supplied through the inlet (224) flows into an inlet plenum region (224a), through the micro channels (232a), through the micro channels (232b) and into an outlet plenum (225a), and then out of the outlet port (225).

In an exemplary embodiment where the cooler base (231) is made of copper, or another metallic material that is not CTE matched to the chip material (silicon), the high performance chip (212) can be thermally coupled to the bottom surface of the copper base (231) (in the region aligned to the fine-pitch micro channels (232a) using a thermal bond TB1 formed of a flexible (semi-rigid) filled polymer adhesive (thermal resistance of about 13 C-mm$^2$/W with a 0.0012 inch bond line) which can tolerate the thermal expansion mismatch between the silicon and copper, while providing an effective low thermal resistance bond or with a thick Indium solder layer, 0.1 to 0.25 mm (thermal resistance of about 6 C-mm$^2$/W) which can also tolerate the thermal expansion mismatch between the silicon and copper, which a thin Indium solder layer (<0.1 mm) could not. To provide reduced thermal resistance, the fine-pitch micro channel pattern (222a) is used in the region aligned to the processor chip (212), whereby processor chip (212) is cooled using the coolant that is input through the inlet (224).

On the other hand, the lower performance cache chip (213) is thermally coupled to the bottom surface of the cooler base (231) using thermal bond TB2 formed from a mechanically compliant, thermally conductive material, which does not support a shear stress and thus, no lateral shear load will be applied to the thermal bond TB1 between the cooler base (231) and backside of the processor chip (212) The cache chip (213) is cooled by the heated water that flows over the coarse pitch micro channel region (232b) downstream from the fine pitch micro channel region (232a).

The thermal resistance for the chip (213) can be adjusted by increasing the width and/or height of the cooling channels (232b) as compared to the dimensions of the micro channels (232a) over the processor chip (212). Again, it is desirable that the total pressure drop of the cooling fluid over the cache chip (213) is less than that over the processor chip (212).

In other exemplary embodiments, if the thermal bond TB2 layer over the cache chip (213) is required to be thicker than that the thermal bond TB1 over the processor chip (212) to insure that the layer over the processor chip (212) is as thin as possible, either the cache chip can be made thinner than the processor chip, or the base of the cooler can be recessed slightly over the cache chip.

In other exemplary embodiments, the micro channel structure discussed with reference to FIGS. 7A~7C can be replaced by other cooling structures such as mesh layers, stacked micro channels, staggered stacked micro channels, which are described in U.S. patent application Ser. No. 12/120,069, entitled "Stacked and Redundant Coolers", filed on May 13, 2008, which is commonly assigned and fully incorporated herein by reference where there is a first region of higher thermal performance (and flow resistance) followed by a second region of lower thermal performance (and flow resistance).

In other exemplary embodiments of the invention, silicon micro channel cooler assembly structures (30,130) such as discussed with reference to FIGS. 1 and 2 for example, may be replaced with copper cooler devices having exemplary frameworks such as described in the above-incorporated U.S. patent application Ser. No. 12/120,069. This application describes exemplary copper cooler structures having fluid fittings, manifold, and cooling layers which are all integrated together, and where the cooling layers may consist of stacked micro channels, stacked staggered micro channels, a mesh, or other structures. When copper cooler structures are used in the exemplary structure (100) of FIG. 2, for example, a copper cooler could be directly secured to the sides of each aperture (141) in the thermal hat (140) using a semi-hermetic adhesive such as silicone and thermally bonded to the back of the chips (112) using a flexible filled polymer material or a thick Indium solder layer after the thermal hat (140) has been attached to the MCM and base ring. Hose barb fittings can be built onto the top surface of the copper coolers and flexible hoses used to provide coolant flow from fittings mounted on manifolds formed in the top surface of the thermal hat (140), rather than the exemplary embodiment of FIG. 2 where fluid manifolds are formed in a separate fluid manifold (150) device that is mounted to the thermal hat (140).

Figure 8A:
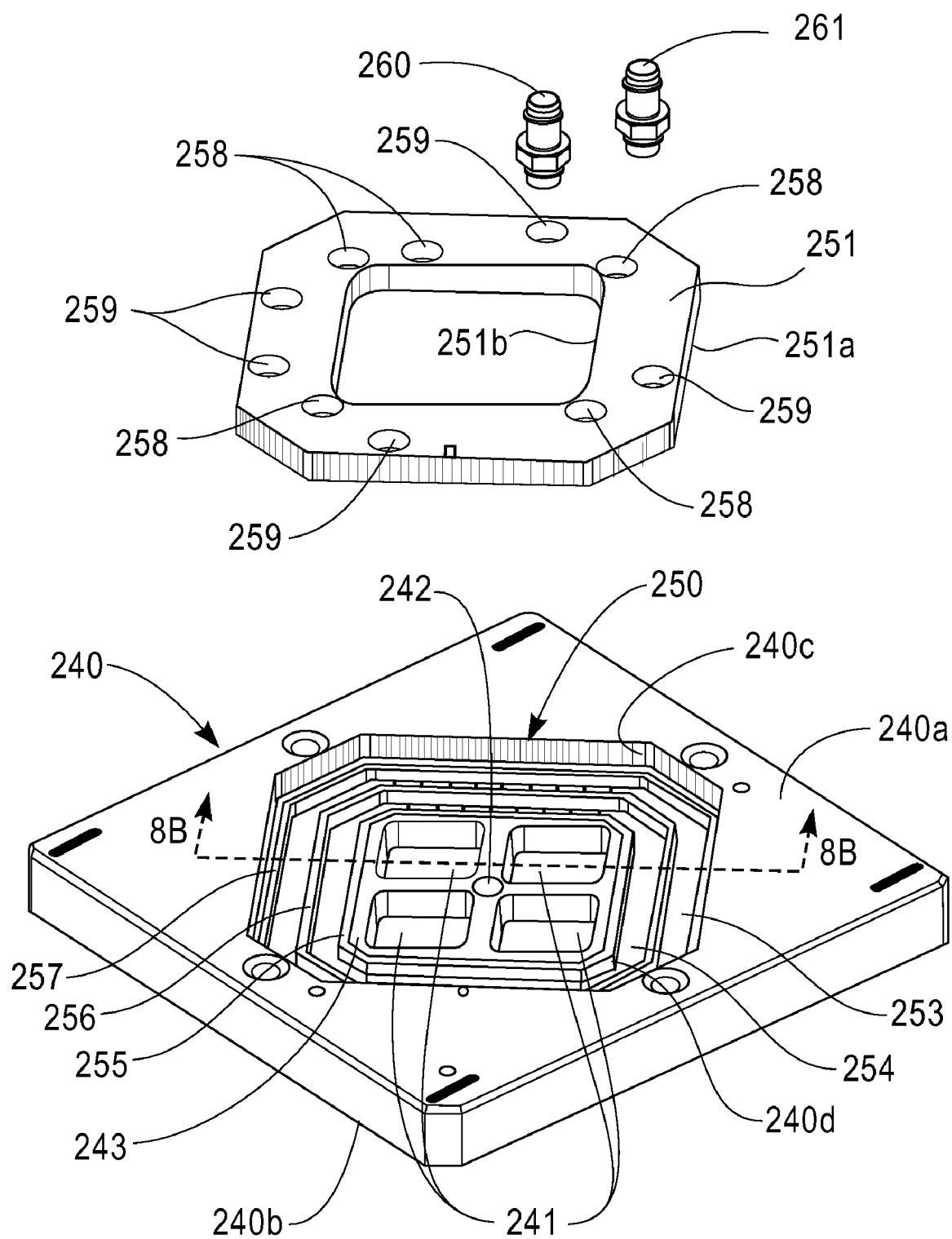
FIG. 8A is an exploded schematic view of a thermal hat with integrated inlet and outlet plenums according to an exemplary embodiment of the invention.
Figure 8B:
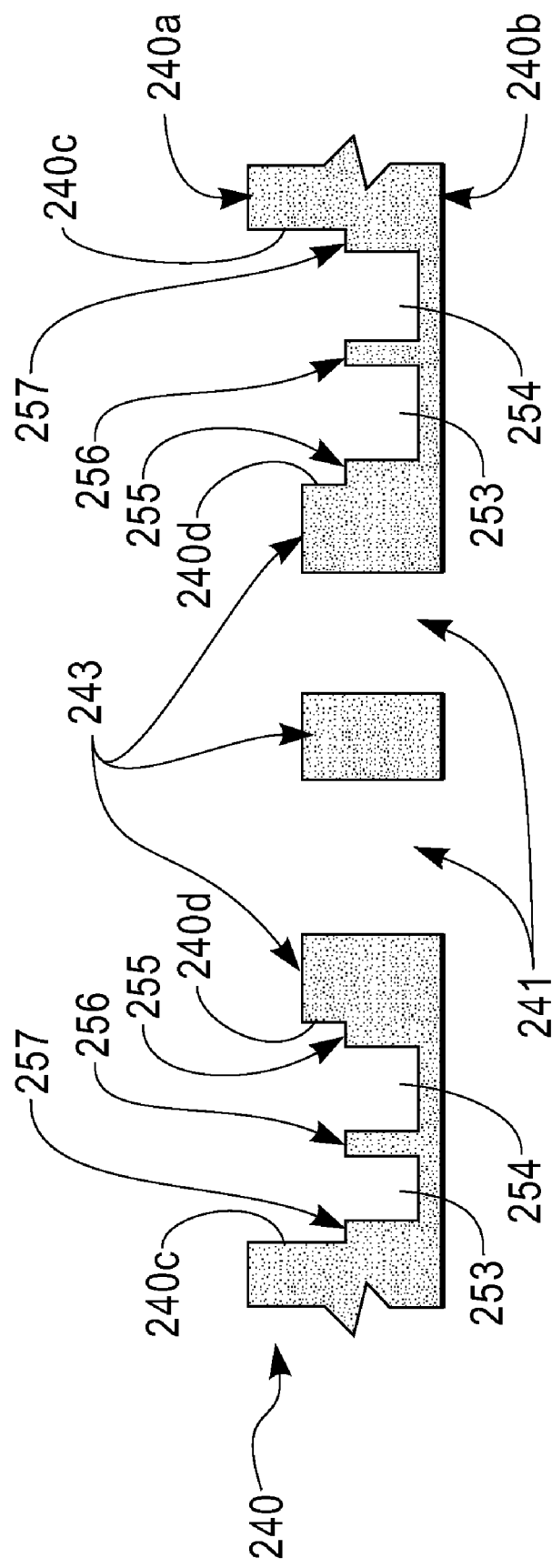
FIG. 8B is a cross-sectional schematic view of the exemplary thermal hat of FIG. 8A along line 8B-8B.

By way of example, FIGS. 8A and 8B schematically illustrate an exemplary embodiment of a thermal hat structure (240) according to an exemplary embodiment of the invention, which may be used in place of the thermal hat (140) and fluid manifold (150) in the electronic module (100) of FIG. 2. In particular, FIG. 8A is an exploded schematic view of a thermal hat (240) with integrated inlet/outlet plenums according to an exemplary embodiment of the invention and FIG. 8B is a cross-sectional schematic view of the exemplary thermal hat (240) of FIG. 8A along line 8B-8B. As depicted in FIGS. 8A and 8B, the thermal hat (240) is essentially a planar square/rectangular-shaped package cover having upper and lower surfaces (240a) and (240b) and a recessed/patterned region (250) formed in the upper surface (240a). The recessed region (250) comprise a plurality of apertures (241) and a screw hole (242) formed in a raised (mesa) central region (243) thereof. The apertures (241) are sized, shaped, and arranged to insertably receive each of the copper cooler devices when the thermal hat (240) is mounted to a substrate and thermally coupled to the chips for heat removal (as will be discussed below with reference to FIG. 9, for example).

The recessed region (250) further includes recessed octagonal channels comprising an outlet plenum (254) and an inlet plenum (253), which are integrally formed as part of the thermal hat (240). The outlet plenum (254) is defined in part by sidewall elements (255) and (256) and the inlet plenum (253) is defined in part by sidewall elements (256) and (257). The sidewall element (255) forms a ledge structure around a bottom portion of an outer perimeter sidewall (240d) of the raised central element (243) and the sidewall element (257) forms a ledge structure around a bottom portion of a sidewall (240c) that defines a perimeter of the recessed region (250).

The thermal hat (240) comprise a ring shaped plate (251) having an outer sidewall surface (251a) and inner sidewall surface (251b) and a plurality of outlet ports (258) and inlet ports (259). The ring-shaped plate (251) is sized and shaped to fit within the recessed region (250) in the body of the thermal hat (240) to enclose the inlet/outlet plenums (253, 254), while exposing the inner mesa region (243). In particular, the ring-shaped plate (251) is sized and shaped such that the sidewalls (251a) and (251b) of the ring plate (251) interface with, and are disposed between, the sidewall surfaces (240c) and (240d), respectively, and such that a bottom surface of the plate (251) is disposed on the top of sidewall elements (255, 256 and 257). The plate (251) may be fixedly connected by brazing using known techniques. The outlet ports (258) are formed to align with the outlet plenum (254) and the inlet ports (259) are formed to align with the inlet plenum (253) when the ring-shaped plate (251) is fixed in the recessed region (250) of the body of the thermal hat (240). A plurality of threaded fittings (260) may be secured into the inlet openings (259) and a plurality of threaded fittings (261) may be secured into the outlet openings (258).

Figure 9:
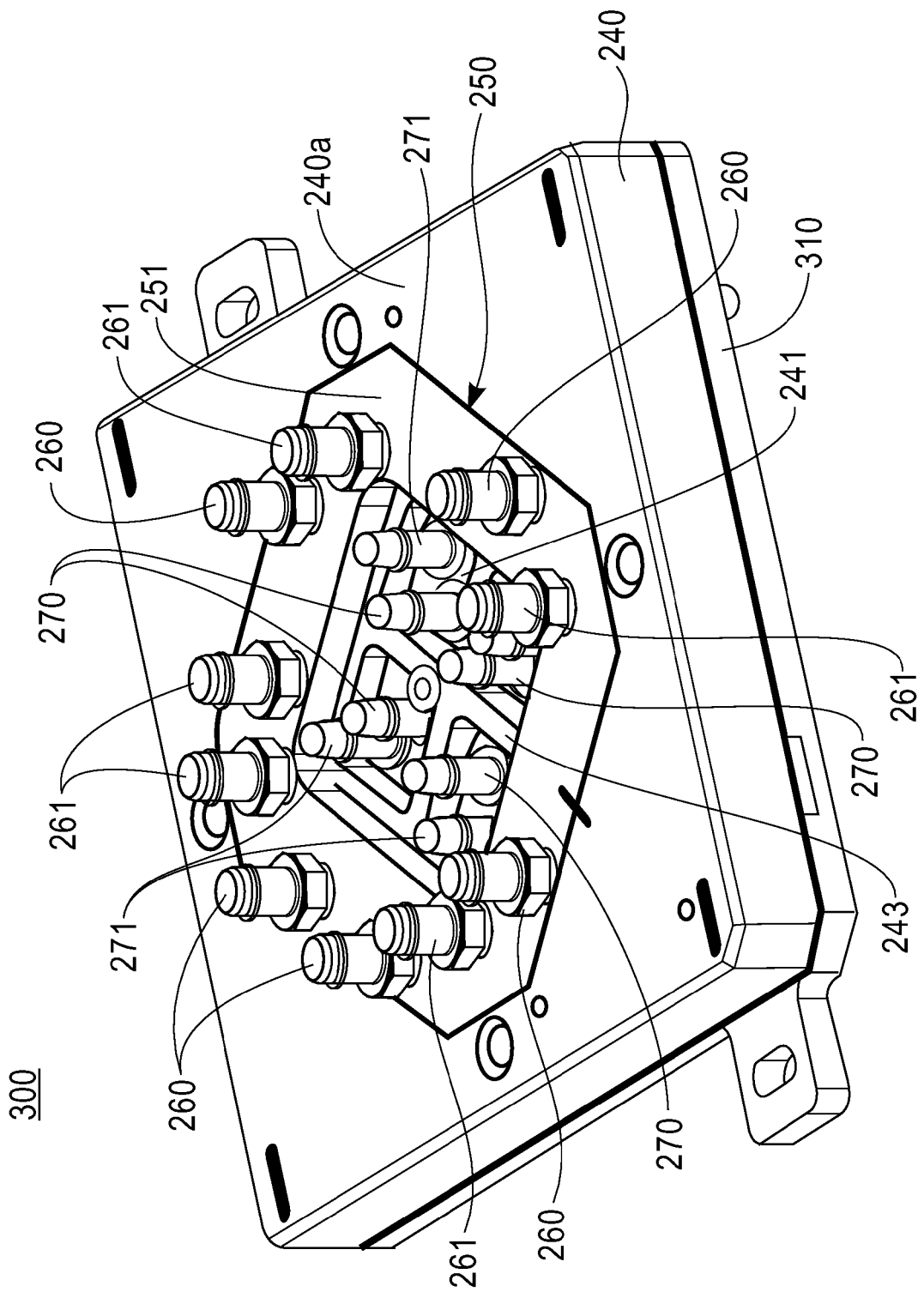
FIG. 9 is a schematic perspective view of an electronic module according to an exemplary embodiment of the invention, which incorporates the exemplary thermal hat of FIG. 8A.

FIG. 9 is a schematic perspective view of an electronic module according to an exemplary embodiment of the invention, which incorporates the exemplary thermal hat of FIG. 8A. FIG. 9 is a perspective view of an electronic module (300) that may be formed by packaging the exemplary thermal hat (240) structure of FIGS. 8A/B with the MCM (110) of FIG. 2. FIG. 9 depicts the thermal hat (240) with the ring-shaped plate (251) disposed in the recessed region (250) exposing the inner mesa region (243), a plurality of threaded fittings (260), (261), and a base ring (310) to fixedly couple the MCM (110) (not specifically shown) to the bottom (240b) of the thermal hat (240). In the exemplary embodiment of FIG. 9, a copper cooler structure may be directly secured to the inner sidewalls of each aperture (241) in the thermal hat (240) using a semi-hermetic adhesive such as silicone and thermally bonded to the back of the chips (112) on the chip substrate (111) (FIG. 2) using a flexible filled polymer material or thick Indium solder layer after the thermal hat (240) has been attached to the MCM (110) and base ring (310).

It should be noted that a mechanically compliant thermally conductive material could also be used between the copper cooler structure and the back of the chips (112) if desired. Since individual copper cooler structures are used for each of chip (112), the variations in thickness and tilt can be compensated for and a thin bond line established. A plurality of hose barb fittings (270) and (271) may be built onto the top surface of the copper coolers, which extend through respective apertures (241), where the fittings (270) are connected to inlet ports of the coolers and fittings (271) are connected to outlet ports of the coolers.

In the exemplary embodiment of FIG. 9, there are five threaded fittings (260) that are secured in inlet ports (259) that lead to the inlet plenum (253) of the thermal hat (240), and five threaded fittings (261) that are secured in outlet ports (258) that lead to the outlet plenum (254) of the thermal hat (240). Each one of the fittings (270) to the inlets of the copper coolers is connected to a respective one of four of the fittings (260) via a coolant hose (not shown) while the fifth one of the fittings (260) is connected to an external coolant supply line. Similarly, each one of the fittings (271) to the outlets of the copper coolers is connected to a respective one of four of the fittings (261) via a coolant hose, while the fifth one of the fittings (261) is connected to an external coolant return line. In this configuration, coolant flows into the inlet plenum (253) and is distributed to each of the inlet ports (259), where the coolant flows out of the inlet plenum (253) and into the inlet fittings (270) of the copper coolers via connecting coolant hoses, while coolant flows out of the outlet fittings (271) of the copper coolers and into the outlet plenum (254) of the thermal hat (240) via the fittings (261) and connecting coolant hoses, where the coolant flows in the outlet plenum (254) to the outlet fitting (261) connected to the coolant supply return hose.

In the exemplary embodiments of FIGS. 8A/B and 9, the cache memory chips (113) may be cooled via thermal conduction from the bottom surface (240b) (to which the chips (113) are thermally bonded) of the thermal hat (240) which is aligned to the outlet plenum (254), where heat is absorbed by the flow of heated coolant in the outlet plenum (254) from the bottom surface (240b) of the thermal hat (240). The cache memory chips (113) are thermally bonded to the bottom surface (240b) of the thermal hat (240) using a mechanically compliant thermal conductive material that will not transfer a shear force between the thermal hat (240) and the cache chips (113) during thermal cycling. In the exemplary embodiment, it is preferred that the inner manifold channel (254) be used as the outlet manifold as it would be more aligned to the cache chips (113) as compared to the outer manifold channel (253), which would receive coolant flow for distribution to the inlets (270) of the copper coolers. It is to be noted that the outer manifold channel (253) could be repositioned to reduce the amount of cooling provided to the cache chips (113) by the inlet fluid flowing therein.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electronic apparatus, comprising:
a chip level package structure comprising a package substrate, first and second IC (integrated circuit) chips flip-chip mounted on a first surface of the package substrate; and
a cooling module thermally coupled to the first and second IC chips, the cooling module comprising a liquid coolant inlet port, a liquid coolant outlet port, and a coolant flow path extending within the cooling module from the liquid coolant inlet port to the liquid coolant outlet port;
wherein the first IC chip is thermally coupled to a first portion of the cooling module which is cooled by coolant flowing in the coolant flow path including a micro channel cooler disposed in the cooling module and in contact with the first IC chip, and
wherein the second IC chip is thermally coupled to a second portion of the cooling module which is cooled by heated coolant fluid flowing in the coolant flow path, wherein the second IC chip is disposed away from the micro channel cooler, such that the cooling module provides different thermal resistances to the first IC chip and the second IC chip, respectively,
wherein the cooling module comprises:
a planar heat conducting device having first and second opposing surfaces, and an aperture formed through the planar heat conducting device between the first and second opposing surfaces thereof;
a cooler assembly disposed in the aperture of the planar heat conducting device wherein the cooler assembly comprises first and second opposing surfaces, a cooler assembly inlet port and a cooler assembly outlet port disposed on the first surface, and a coolant flow path extending through the cooler assembly from the cooler assembly inlet port to the cooler assembly outlet port; and
a fluid manifold comprising an inlet plenum and an outlet plenum which define portions of the coolant flow path of the cooling module, wherein the inlet and outlet plenums are configured such that fluid flow in the inlet and outlet plenums is in direct contact with the planar heat conducting device;
wherein the planar heat conducting device is stacked on the chip package structure where the backside of the first IC chip is thermally bonded to the second surface of the cooler assembly and where the second IC chip is thermally coupled to a region of the second surface of the planar heat conducting device;
a first fluid connection between the cooler assembly input port and the inlet plenum; and
a second fluid connection between the cooler assembly output port and the outlet plenum.

2. The apparatus of claim 1, wherein the first IC chip is thermally coupled to the cooling module using a first thermally conductive bonding material, and wherein the second chip is thermally coupled to the cooling module using a second thermally conductive material.

3. The apparatus of claim 1, wherein the first IC chip is a processor chip, and wherein the second IC chip is a memory chip.

4. The apparatus of claim 1, wherein the coolant flow path is structured such that a flow resistance of the coolant fluid flowing in the coolant flow path near the first portion of the cooling module is greater than a flow resistance of the heated coolant fluid flowing in the coolant flow path near the second portion of the cooling module.

5. The apparatus of claim 1, wherein the fluid manifold is a planar device having first and second opposing surfaces, wherein the inlet and outlet plenums are formed in the second surface of the fluid manifold and having a manifold inlet port and a manifold outlet port formed in the first surface of the fluid manifold where the manifold inlet port extends from the first surface to the inlet plenum and the manifold outlet port extends from the first surface of the fluid manifold to the outlet plenum, and wherein the second surface of the fluid manifold is mechanically coupled to the first surface of the planar heat conducting device such that the inlet plenum is aligned to the inlet port of the cooler assembly and the outlet plenum is aligned to the outlet port of the cooler assembly.

6. The apparatus of claim 1, wherein the fluid manifold is integrally formed as part of the planar heat conducting device wherein the inlet and outlet plenums are formed in the first surface of the planar heat conducting device surrounding the aperture, and are covered by a manifold cover plate.

7. The apparatus of claim 1, wherein the cooler assembly comprises:
the micro channel cooler formed of silicon rigidly bonded to the first IC chip and having micro flow channels defined by a pattern of silicon thermal fins;
a micro manifold device stacked on the micro channel cooler to distribute coolant to and from the micro channel cooler, and wherein the micro manifold device includes a surface that defines the first surface of the cooler assembly having the cooler assembly inlet port and the cooler assembly outlet port, and wherein the micro manifold device includes input and output manifolds that define part of the coolant flow path extending through the cooler assembly from the cooler assembly inlet port to the cooler assembly outlet port.

8. The apparatus of claim 1, wherein the cooler assembly comprises an integrated device formed of metal and rigidly bonded to the first IC chip, wherein the integrated device comprises cooling layers, manifolds, and a surface that defines the first surface of the cooler assembly having the inlet and outlet ports of the cooler assembly, and wherein the integrated device includes input and output manifolds that define part of the coolant flow path extending through the cooler assembly from the cooler assembly inlet port to the cooler assembly outlet port.

9. The apparatus of claim 8, wherein the integrated device includes stacked micro channels, mesh structures, or staggered stacked micro channels.

10. The apparatus of claim 1, wherein the cooler module and the package substrate are joined to form a semi-hermetic enclosure around the first and second IC chips.

11. An electrical apparatus, comprising:
a chip level package structure comprising a package substrate, first and second IC (integrated circuit) chips flip-chip mounted on a first surface of the package substrate;
a planar heat conducting device having first and second opposing surfaces, and an aperture formed through the planar heat conducting device between the first and second opposing surfaces thereof;
a cooler assembly disposed in the aperture of the planar heat conducting device wherein the cooler assembly comprises first and second opposing surfaces, a cooler assembly inlet port and a cooler assembly outlet port disposed on the first surface of the cooler assembly, and a coolant flow path extending through the cooler assembly from the cooler assembly inlet port to the cooler assembly outlet port; and
a planar fluid manifold comprising first and second opposing surfaces, a manifold inlet port and a manifold outlet port formed on the first surface thereof, an inlet plenum and an outlet plenum formed on the second surface thereof, where the manifold inlet port extends from the first surface of the planar fluid manifold to the inlet plenum, wherein the outlet manifold port extends from the first surface of the planar fluid manifold to the outlet plenum,
wherein the planar heat conducting device is stacked on the chip level package structure where a backside of the first IC chip is aligned and thermally bonded to the second surface of the cooler assembly and where a backside of the second IC chip is thermally coupled to a region of the second surface of the planar heat conducting device;
wherein the second surface of the fluid manifold is coupled to the first surface of the planar heat conducting device such that (i) inlet plenum is aligned to the cooler assembly inlet port to provide a first fluid connection for delivering coolant fluid from the input plenum to the cooler assembly input port and such that (ii) the outlet plenum is aligned to the cooler assembly outlet port to provide a second fluid connection for delivering the coolant fluid from the cooler assembly output port to the outlet plenum.

12. The apparatus of claim 11, wherein the planar heat conducting device is one of a package lid, a thermal hat, and a heat spreader, and wherein the inlet plenum and the outlet plenum are formed on the second surface of the fluid manifold such that fluid flow in the inlet plenum and the outlet plenum is in direct contact with portions of the first surface of the planar heat conducting device with the first surface of the planar heat conducting device providing a lid to enclose the input plenum and the output plenum when the fluid manifold is coupled to the planar heat conducting device, wherein the coolant fluid flows through the cooler assembly to cool the first IC chip, wherein the coolant fluid flows out of the cooler assembly outlet port and through the outlet plenum over a region of the first surface of the planar heat conducting device that is aligned to the region on the opposing second surface of the planar heat conducting device to which the second IC chip is thermally coupled to thereby cool the second IC chip.

13. The apparatus of claim 11, wherein the first IC chip is thermally coupled to the cooler assembly using a first thermally conductive bonding material, and wherein the second IC chip is thermally coupled to a portion of the second surface of the planar heat conducting device using a second thermally conductive material.

14. The apparatus of claim 11, wherein the first IC chip is a processor chip, wherein the second IC chip is a memory chip, and wherein the planar heat conducting device and the package substrate are joined to form a semi-hermetic enclosure around the first and second IC chips.

* * * * *